(12) United States Patent
Haneda et al.

(10) Patent No.: US 7,042,758 B2
(45) Date of Patent: May 9, 2006

(54) MAGNETIC CELL AND MAGNETIC MEMORY

(75) Inventors: Shigeru Haneda, Kanagawa-Ken (JP); Shiho Nakamura, Kanagawa-Ken (JP); Yuuichi Oosawa, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 10/943,835

(22) Filed: Sep. 20, 2004

(65) Prior Publication Data
US 2005/0105325 A1 May 19, 2005

(30) Foreign Application Priority Data
Sep. 29, 2003 (JP) .............................. 2003-338099

(51) Int. Cl.
*G11C 7/00* (2006.01)
(52) U.S. Cl. ...................... 365/158; 365/171
(58) Field of Classification Search ................ 365/158, 365/171, 145
See application file for complete search history.

(56) References Cited

U.S. PATENT DOCUMENTS 6,847,509 B1 * 1/2005 Yoshikawa et al. ..... 360/324.12
6,914,575 B1 * 7/2005 Rawnick et al. ......... 343/781 P

OTHER PUBLICATIONS

J. Z. Sun, et al., "Batch-fabricated spin-injection magnetic switches", Applied Physics Letters, vol. 81, No. 12, Sep. 16, 2002, pp. 2202-2204.

* cited by examiner

*Primary Examiner*—Vu A. Le
(74) *Attorney, Agent, or Firm*—Oblon, Spivak, McClelland, Maier & Neustadt, P.C.

(57) ABSTRACT

It is possible to provide a magnetic cell having a high developing rate of MR characteristics and a reduced fluctuation without causing element falling-down and a magnetic memory having the same. A magnetic cell includes: a lower electrode; an electrically conductive pillar formed on the lower electrode; a magnetoresistance effect film having at least two ferromagnetic layers formed on the electrically conductive pillar and an intermediate layer provided between the ferromagnetic layers; an upper electrode formed on the magnetoresistance effect film; a support layer formed from at least one metal directly on a side face of the electrically conductive pillar or via an insulating layer; and a current diffusion preventing layer provided between the support layer and the lower electrode, wherein a height of the electrically conductive pillar, a thickness of the current diffusion preventing layer, and a thickness of the support layer satisfy relationships of $$h > t1 + t2 > \frac{30}{30+L} \times h$$

where h represents the height of the electrically conductive pillar, t1 represents the thickness of the current diffusion preventing layer, t2 represents the thickness of the support layer, and L (nm) represents a length of a short side of the electrically conductive pillar.

20 Claims, 20 Drawing Sheets

| WAFER No. | THE EMBODIMENT | COMPARATIVE EXAMPLE 1 | COMPARATIVE EXAMPLE 2 | COMPARATIVE EXAMPLE 3 |
|---|---|---|---|---|
| 1 | 97 | 35 | 43 | 3 |
| 2 | 96 | 23 | 47 | 10 |
| 3 | 99 | 38 | 40 | 7 |
| 4 | 96 | 29 | 41 | 18 |

FIG. 17

MAGNETIC CELL AND MAGNETIC MEMORY

CROSS-REFERENCE TO RELATED APPLICATIONS

This application is based upon and claims the benefit of priority from prior Japanese Patent Application No. 2003-338099, filed on Sep. 29, 2003 in Japan, the entire contents of which are incorporated herein by reference.

BACKGROUND OF THE INVENTION

1. Field of the Invention

The present invention relates to a magnetic cell and a magnetic memory.

2. Related Art

For controlling magnetizing direction of a magnetic body, a method for applying magnetic field on the magnetic body has been conventionally employed. For example, in a hard disc drive, a magnetizing direction of a medium is inverted for performing writing by magnetic field generated from a recording head. In a solid magnetic memory, a current magnetic field generated due to current flowing in a wire provided near a magnetoresistance effect element is applied to a memory cell, so that control on a magnetizing direction of the memory cell is performed. The magnetizing direction controls made by these external magnetic fields are said to be an old technique and an established art.

On the other hand, according to advance of the recent nano-technology, magnetic material particle are made further fine, which results in need for local magnetizing control with nano-scale. However, since the magnetic field is fundamentally provided with a property of expanding in space, it is difficult to conduct localization. According to further fineness of a bit or a memory cell in size, when a specific bit or memory cell is selected and its magnetizing direction is controlled, such a problem about "cross talk" where magnetic field influences an adjacent bit or memory cell occurs noticeably. When a magnetic field generating source is made small for achieving localization of magnetic field, there arises another problem that a sufficient generated magnetic field can not be obtained.

In recent year, "magnetization reversing of current direct driving type" where magnetization reversing takes place due to current flowing in a magnetic body has been found (for example, refer to F. J. Albert, et al., Appl. Phys. Lett. 77, 3809 (2000)).

The magnetization reversing due to current flow is a phenomenon where reversing of magnetization is caused by transmitting/operating an angular momentum of spin-polarized electrons generated when spin-polarized current passes through a magnetic body on an angular momentum of a magnetic body to be magnetization-reversed. Direct serving on a magnetic body of nano-scale is made possible by utilizing the phenomenon, so that recording on a further fine magnetic body becomes possible.

In the conventional magnetic element utilizing magnetization reversing of current direct driving type, methods where a laminated magnetic body film is directly etched by such a process as a direct milling or a RIE (Reactive Ion Etching) are used. In these direct etching processes, however, when a much fine element with a size of 10 nm or less is etched, there is a problem that it is difficult to form such an element having a high developing rate of MR characteristics without fluctuation due to damage during the etching process or re-adhesion of etched material. There is a problem that, for forming a small element pillar, an element itself must be prevented from falling down.

In order to form a fine element without using an etching process while preventing the element from falling down, there is such a trial that fine holes are formed in an insulator and formation is conducted by embedding (for example, refer to J. Z. Sun, et al., Appl. Phys. Lett. 81, 2202 (2002)). In the trial, however, there is a problem that a film forming apparatus is required for a high directivity and a fine element can not be manufactured with the embedding structure when a structure film thickness of a magnetic body film portion performing current direct driving is increased.

SUMMARY OF THE INVENTION

In view of the above circumstances, the present invention has been made, and an object thereof is to provide a magnetic cell having a high developing rate of MR characteristics and a reduced fluctuation without causing element falling-down and a magnetic memory having the same.

A magnetic memory according a first aspect of the present invention includes: a lower electrode; an electrically conductive pillar formed on the lower electrode; a magnetoresistance effect film having at least two ferromagnetic layers formed on the electrically conductive pillar and an intermediate layer provided between the ferromagnetic layers; an upper electrode formed on the magnetoresistance effect film; a support layer formed from at least one metal directly on a side face of the electrically conductive pillar or via an insulating layer; and a current diffusion preventing layer provided between the support layer and the lower electrode, a height of the electrically conductive pillar, a thickness of the current diffusion preventing layer, and a thickness of the support layer satisfying relationships of $$h > t1 + t2 > \frac{30}{30 + L} \times h$$

where h represents the height of the electrically conductive pillar, t1 represents the thickness of the current diffusion preventing layer, t2 represents the thickness of the support layer, and L (nm) represents a length of a short side of the electrically conductive pillar.

A magnetic memory according to a second aspect of the present invention includes: a memory cell array comprising a plurality of magnetic cells arranged in array manner; and a selecting unit which selects a magnetic cell in the memory cell array to cause writing current or sense current to flow in the selected magnetic cell, each of the magnetic cell including: a lower electrode; an electrically conductive pillar formed on the lower electrode; a magnetoresistance effect film having at least two ferromagnetic layers formed on the electrically conductive pillar and an intermediate layer provided between the ferromagnetic layers; an upper electrode formed on the magnetoresistance effect film; a support layer formed from at least one metal directly on a side face of the electrically conductive pillar or via an insulating layer; and a current diffusion preventing layer provided between the support layer and the lower electrode, a height of the electrically conductive pillar, a thickness of the current diffusion preventing layer, and a thickness of the support layer satisfying relationships of $$h > t1 + t2 > \frac{30}{30+L} \times h$$

where h represents the height of the electrically conductive pillar, t1 represents the thickness of the current diffusion preventing layer, t2 represents the thickness of the support layer, and L (nm) represents a length of a short side of the electrically conductive pillar.

BRIEF DESCRIPTION OF THE DRAWINGS

FIG. 17 is a table for explaining a difference in advantage between the first embodiment and a comparative example;

DETAILED DESCRIPTION OF THE INVENTION

First Embodiment

Figure 1:
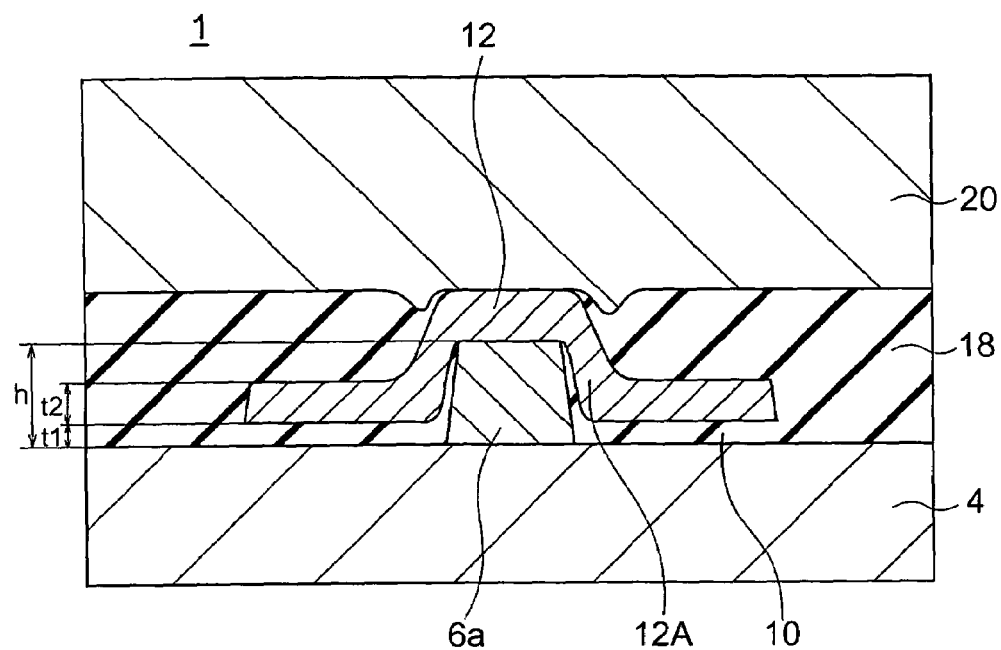
FIG. 1 is a sectional view showing a constitution of a magnetic cell according to a first embodiment of the present invention.

A constitution of a magnetic cell according to a first embodiment of the present invention is shown in FIG. 1. A magnetic cell according to the embodiment is provided with a lower electrode 4, an electrically conductive pillar 6a formed on the lower electrode 4, a magnetoresistance effect film 12 (hereinafter, also called "MR film 12") formed on the electrically conductive pillar 6a, an upper electrode 20 formed on the MR film 12, a support layer 12A formed on a side face of the electrically conductive pillar 6a, and a current diffusion preventing layer 10 formed between the support layer 12A and the lower electrode 4.

The support layer 12A is provided on a side face of the electrically conductive pillar 6a via an insulating film 10. In this embodiment, when a height of the electrically conductive pillar 6a is represented as h, a thickness of the current diffusion preventing layer 10 is represented as t1, a thickness of the support layer 12a is represented as t2 and a length of a short side of the electrically conductive pillar 6a in section in a film face direction is represented as L (nm), a constitution is employed for satisfying the following relational expression.

$$h > t1 + t2 > \frac{30}{30+L} \times h \quad (1)$$

Incidentally, in order to develop "magnetization reversing of a current direct driving type", it is essential to satisfy L≦200 nm. According to the results of study made by the present inventor, it has been found that, when the relational expression is satisfied, falling-down prevention effect of an element becomes noticeable.

Next, derivation of the above relational expression (1) will be explained. For deriving the relationship among the height h of the electrically conductive pillar 6a, the film thickness t1 of the current diffusion preventing layer 10, the film thickness t2 of the supporting layer 12A, and the length L of the short side of the electrically conductive pillar 6a in section in the film face direction, a stacked film comprising a Ta layer with a film thickness of 10 nm and an MoTa layer with a film thickness of 90 nm were formed, and a plurality of electrically conductive pillars whose short side sizes were in a range of 20 to 120 nm regarding a section parallel to a film face, each pillar having an aspect ratio of 1:2, were formed by applying EB (Electron Beam) lithography and ion milling to the stacked layer according to the manufacturing method of the present embodiment described later. Each film thickness (the height h) of the electrically conductive pillar was 100 nm. Thereafter, a current diffusion preventing layer with a film thickness t1 (nm) made of SiOx and a support layer with a film thickness t2 (nm) made of Ta were formed on the electrically conductive pillar layers, and samples were produced while t1 and t2 (incidentally, t2=2×t1) were changed variously. Then, each sample was subjected to heat treatment for about 10 hours in vacuum at a temperature of 270° C. in a state that the sample had been applied with magnetic field of 8×10⁵ A/m.

Figure 37:
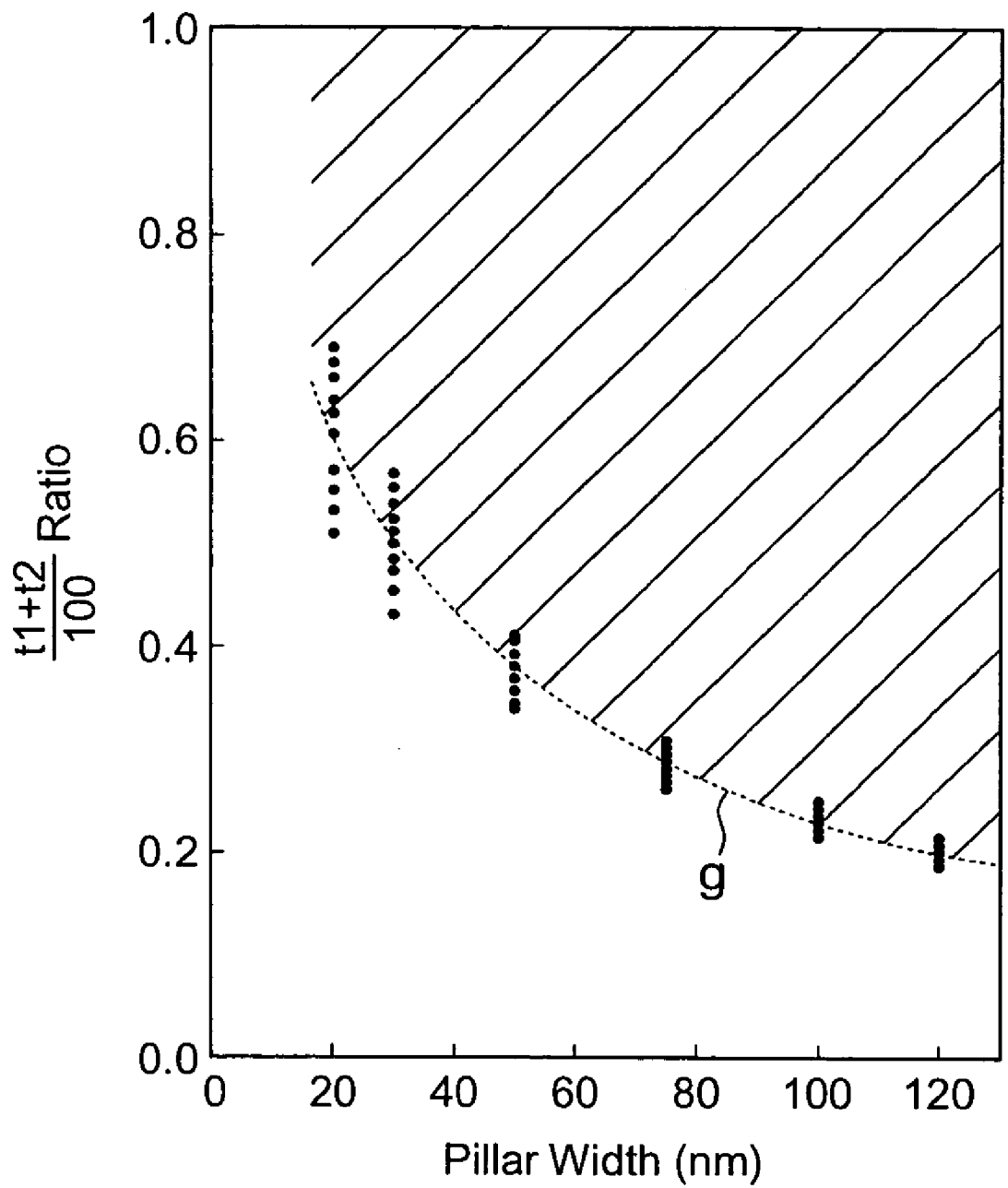
FIG. 37 is a diagram for explaining derivation of a relational expression among a height h of an electrically conductive pillar, a thickness t1 of a current diffusion preventing layer, a thickness t2 of a support layer, and a length L of a short side of the electrically conductive pillar in section thereof in a magnetic cell according to an embodiment of the present invention.

A relationship between the ratio (t1+t2)/100 of the sum (t1+t2) of the film thicknesses of the current diffusion preventing layer and the support layer to the height h (=100 nm) of the electrically conductive pillar and the short edge size L on the section parallel to the film face of the electrically conductive pillar is shown in FIG. 37. In FIG. 37, a graph "g" represents a residual property to the sizes L of 7 remaining samples per 10 element pillars. From this graph "g", the relational expression (1) is derived, where it has been confirmed that almost all electrically conductive pillars remain in a region on an upper side of the graph (a hatching region).

Next, steps of manufacturing a magnetic cell of this embodiment will be explained with reference to FIG. 7 to FIG. 16.

Figure 7:
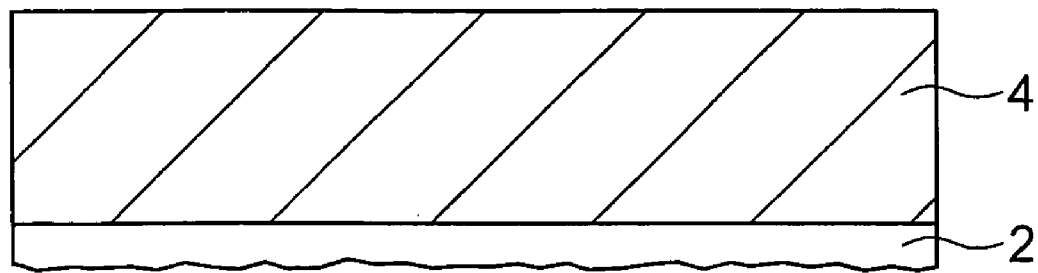
FIG. 7 is a sectional view of a step of manufacturing the magnetic cell according to the first embodiment of the present invention.

As shown in FIG. 7, first, a lower electrode layer 4 is formed by stacking a Ta film with a film thickness of 5 nm, a Cu film with a film thickness of 400 nm and a Ta film with a film thickness of 40 nm on a silicon substrate 2 with a thickness of about 600 μm and a diameter of 3 inches from the substrate side using an ordinary sputtering process. Then, after a surface of the lower electrode layer 4 is planarized and smoothed by applying CMP (Chemical Mechanical Polishing) to the lower electrode layer 4, a measuring electrode terminal portion (not shown) is formed.

Figure 8:
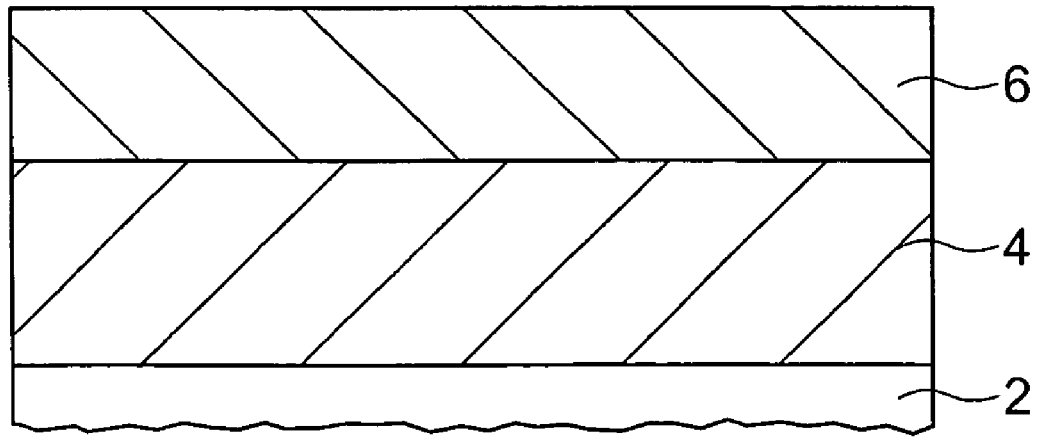
FIG. 8 is a sectional view of a step of manufacturing the magnetic cell according to the first embodiment of the present invention.

Next, an electrically conductive film 6 constituting an electrically conductive pillar was stacked on the planarized lower electrode layer 4 so as to have a thickness of 100 nm (see FIG. 8). As material for the electrically conductive film, titanium (Ti), zirconium (Zr), hafnium (Hf), vanadium (V), niobium (Nb), tantalum (Ta), chromium (Cr), Molybdenum (Mo), tungsten (W), copper (Cu), silver (Ag), gold (Au), platinum (Pt), palladium (Pd), rhodium (Rh), osmium (Os), ruthenium (Ru), aluminum (Al), silicon (Si) or the like can be used. More preferably, the materials include alloys containing at least one of titanium (Ti), zirconium (Zr), hafnium (Hf), niobium (Nb), tantalum (Ta), chromium (Cr), Molybdenum (Mo), tungsten (W), aluminum (Al) and silicon (Si), oxides thereof (for example, TiOx, ZrOx, HfOx, TaOx, CrOx) or nitrides thereof (for example, TiNx, ZrNx, HfNx, TaNx, CrNx, MoNx, WNx, AlNx, SiNx), or oxidized nitrides thereof with electrically conductive property. As the electrically conductive film 6 in this embodiment, a stacked film of an MoTa film with a film thickness of 90 nm and a Ta film with a film thickness of 10 nm was used.

Figure 9:
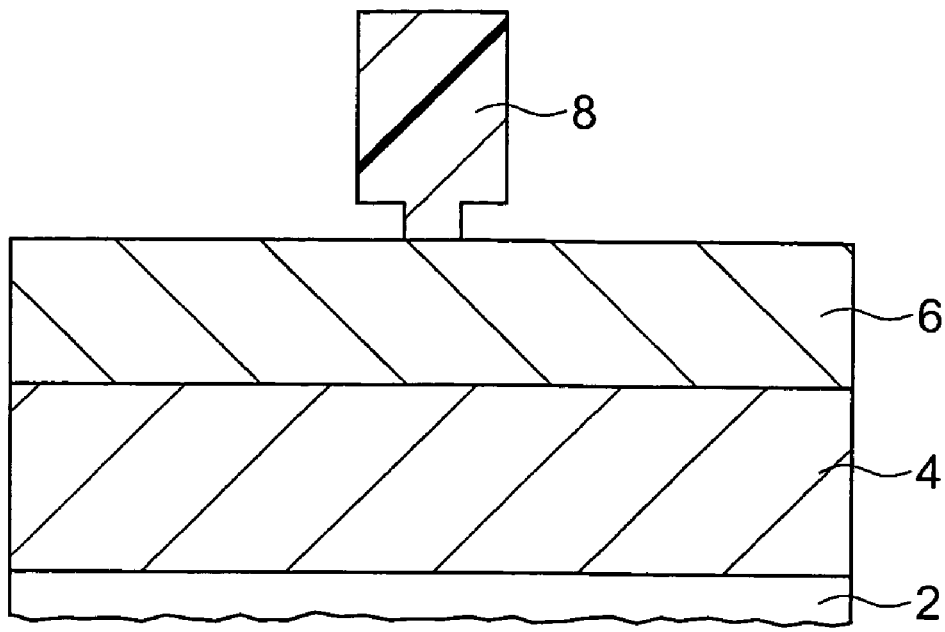
FIG. 9 is a sectional view of a step of manufacturing the magnetic cell according to the first embodiment of the present invention.

Then, a T-shaped resist pattern 8 was formed using a photoresist or resist for electron beam retention (hereinafter, called "EB"), as shown in FIG. 9. Here, it is desirable that the resist pattern 8 takes such a shape as a rectangle or a hexagon with a longer side in a vertical direction (or in a horizontal direction). That is, it is desirable that the resist pattern 8 has an aspect ratio of about 1:1 to 1:5 and it has an optically uniaxial profile magnetism anisotropy on a magnetic film formed on the electrically conductive film 6. It is desirable that one side in a longitudinal direction of each film is set in a range of 5 mn or more to 1000 mn or less. In this embodiment, the resist pattern 8 has a size of about 100 nm×200 nm.

Figure 10:
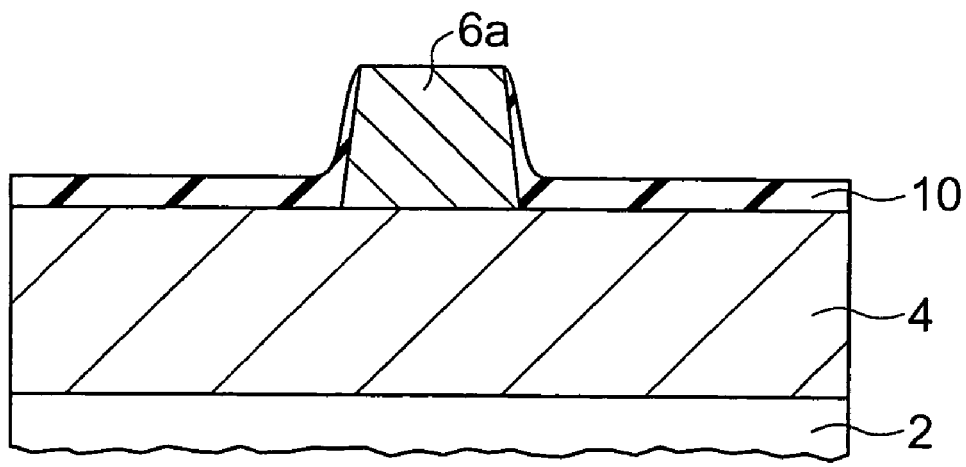
FIG. 10 is a sectional view of a step of manufacturing the magnetic cell according to the first embodiment of the present invention.

Next, the electrically conductive pillar 6a with a height of 100 nm was formed by patterning the electrically conductive film 6 using the resist pattern 8 as a mask by an ion milling apparatus. Thereafter, an insulating material (or body) constituting the current diffusion preventing layer 10 was stacked on the electrically conductive pillar 6. As the insulating material, silicon oxide (SiOx), aluminum oxide (AlOx) or the like can be used. In the embodiment, SiOx was formed to reach a film thickness of 20 nm using a reactive sputter process. After the insulator was formed, the resist pattern 8 was removed using organic solvent to form an electrically conductive pillar portion 6a and the a current diffusion preventing layer 10 such as shown in FIG. 10.

Figure 2:
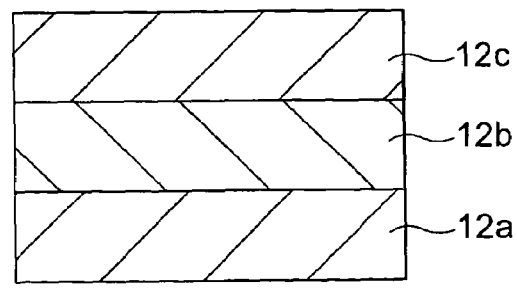
FIG. 2 is a sectional view showing a constitution of an MR film according to an embodiment of the present invention.

As shown in FIG. 2, the MR film 12 is provided with a recording magnetic layer 12a whose magnetization orientation variable (also called "a soft magnetic layer 12a), an intermediate layer 12b and a reference magnetic layer 12c whose magnetization orientation is pinned (also called "a hard magnetic layer 12c").

Figure 11:
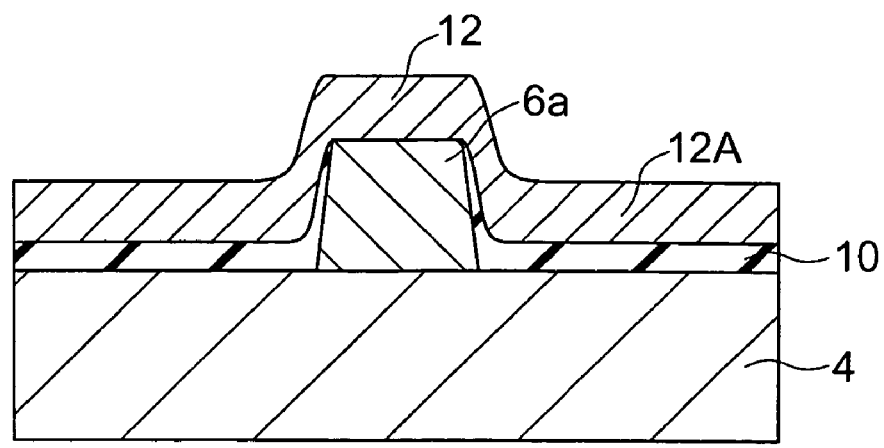
FIG. 11 is a sectional view of a step of manufacturing the magnetic cell according to the first embodiment of the present invention.

Then, as shown in FIG. 11, a stacked film comprising a soft magnetic layer, an intermediate layer and a hard magnetic layer constituting the MR film 12 was formed. The substrate 2 was omitted on FIG. 2 and figures subsequent thereto. As each material for the hard magnetic layer and the soft magnetic layer, iron (Fe), cobalt (Co) or nickel (Ni), alloy containing at least one element selected from a group consisting of iron (Fe), cobalt (Co), nickel (Ni), manganese (Mn) and chromium (Cr), nickel-iron (NiFe) base alloy called "Parmalloy" or such soft magnetic material as cobalt-niobium-zirconium (CoNbZr) base alloy, iron-tantalum-carbon (FeTaC) base alloy, cobalt-tantalum-zirconium (CoTaZr) base alloy, aluminum iron-silicon (FeAlSi) base alloy, boron iron (FeB) base alloy, or iron cobalt boron (CoFeB) base alloy, Heuslar alloy, magnetic semiconductor material, or half metal magnetic substance oxide (or nitride), or the like can be used. It is preferable that the soft magnetic layer is made of magnetic material softer than that for the hard magnetic layer.

As the magnetic semiconductor material, for example, one comprising at least one magnetic element of iron (Fe), cobalt (Co), nickel (Ni), chromium (Cr) and manganese (Mn) and compound semiconductor or oxide semiconductor can be used. Specifically, such material includes GaMnN, MnAs, CrAs, GaCrAs, ZnO:Fe, MgFeO or the like.

The half metal magnetic substance oxide (nitride) can include, for example, $CrO_2$, $Fe_3O_4$, and $La_{1-x}Sr_xMnO_3$. That is, material having magnetic characteristics meeting application thereof can be properly selected from these materials.

On the other hand, the magnetic layer can be constituted of a continuous film made of magnetic substance, or it may be a film having a structure where magnetic substance fine particles have been formed or deposited in a matrix made of non-magnetic substance.

Specifically, the soft magnetic layer can takes a two-layered structure comprising a first layer made of cobalt (Co) or iron cobalt (CoFe) alloy and a second layer made of Permalloy alloy made of iron nickel (NiFe) or iron nickel cobalt (NiFeCo) or nickel (Ni), or it takes a three-layered structure comprising a first layer made of cobalt (Co) or iron cobalt (CoFe) alloy, a second layer made of Permalloy alloy made of iron nickel (NiFe) or iron nickel cobalt (NiFeCo) or nickel (Ni), and a third layer made of cobalt (Co) or iron cobalt (CoFe) alloy.

In the magnetic layers having the multi-layered structure, it is preferable that a thickness of cobalt (Co) or iron cobalt (CoFe) alloy is in a range of 0.2 nm to 1 nm.

It is preferable that the soft magnetic layer is constituted as a three-layered film comprising a magnetic layer such as Parmalloy/a non-magnetic layer (with a thickness of 0.2 nm to 3 nm) such as copper (Cu) or ruthenium (Ru)/a magnetic layer such as Parmalloy which have been subjected to interlayer exchanging bonding.

In order to fix magnetization in the hard magnetic layer, it is advantageous that, when exchanging bias is applied to an antiferromagnetic layer stacked on the hard magnetic layer, or exchanging bias is applied to the hard magnetic layer stacked with a non-magnetic layer made of ruthenium (Ru), copper (Cu) or the like, a ferromagnetic layer and an antiferromagnetic layer, an output signal with large magnetizing direction control and magnetoresistance effect can be obtained. Therefore, as the antiferromagnetic material, it is desirable that iron-manganese (FeMn), platinum-manganese (PtMn), palladium-manganese (PdMn) or platinum-palladium-manganese (PdPtMn) or the like can be used.

It is desirable that the intermediate layer is a layer including one rare metal such as copper (Cu), silver (Ag), gold (Au), or non-magnetic conductive alloy including at least one of these rare metals as a point contact, or a layer made of non-magnetic electrically conductive alloy containing one or more of these rare metals.

It is preferable that a thickness of the hard magnetic film is in a range of 0.6 nm to 100 nm, and it is desirable that a thickness of the soft magnetic layer is in a range of 0.2 nm to 50 nm. It is also desirable that a thickness of the intermediate layer is in a range of 0.2 nm to 100 nm.

Modified Embodiment

Figure 3:
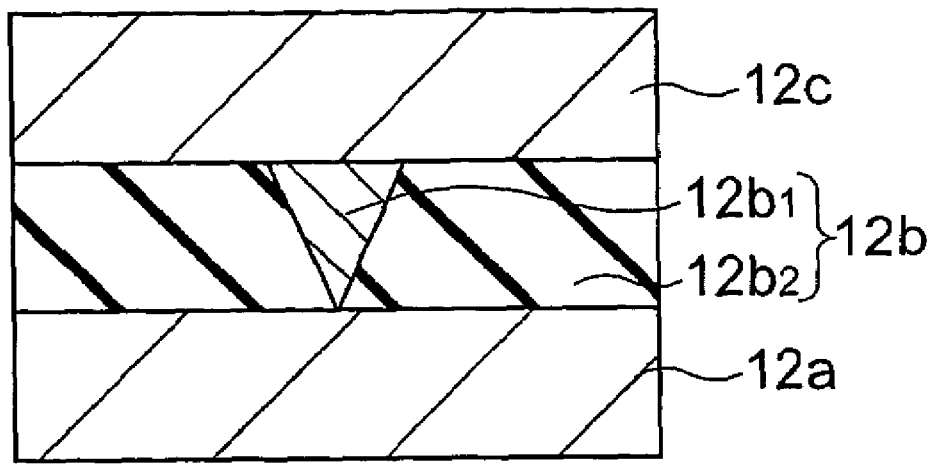
FIG. 3 is a sectional view showing a constitution of an MR film according to an embodiment of the present invention.

As shown in FIG. 3, for example, regarding the intermediate layer, "a point contact", namely, a fine contact $12b_1$ having a contacting area of 100 $nm^2$ or less is provided in an intermediate layer 12b, and a soft magnetic layer 12a and a hard magnetic layer 12c are electrically connected to each other via the fine contact point $12b_1$. The fine contact point $12b_1$ can be formed such that one portions of the hard magnetic layer 12c and the soft magnetic layer 12a extend or it can be formed of such rare metal as copper (Cu), silver (Ag) or gold (Au), or alloy containing at least one these rare metals. In the intermediate layer 12b, a periphery of the fine contact point $12b_1$ is covered with an insulator $12b_2$ such as silicon oxide (SiOx) or aluminum oxide (AlOx).

Figure 4:
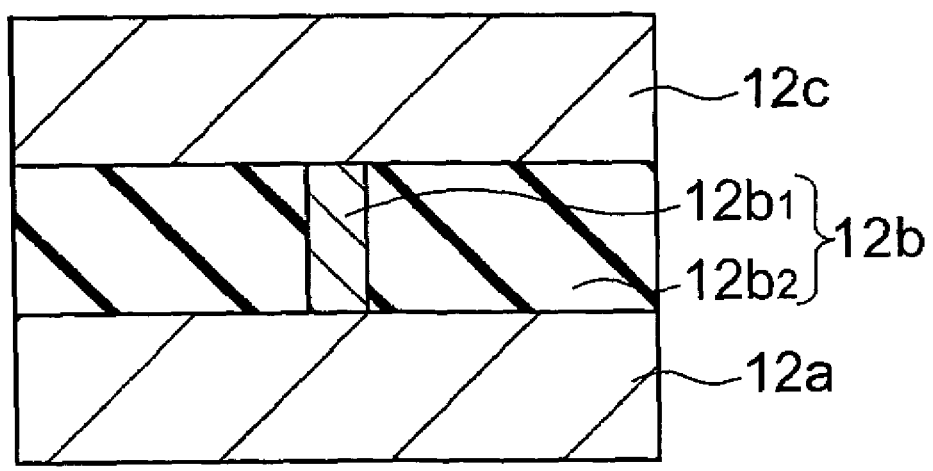
FIG. 4 is a sectional view showing a constitution of an MR film according to an embodiment of the present invention.
Figure 5:
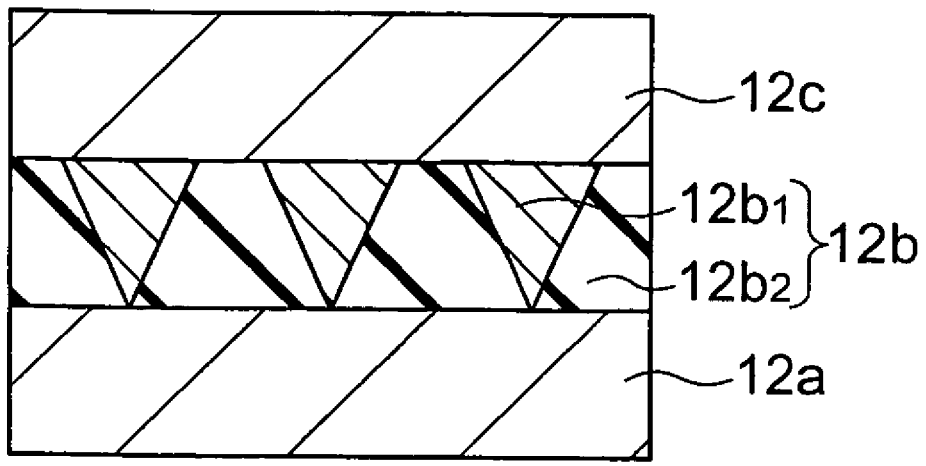
FIG. 5 is a sectional view showing a constitution of an MR film according to an embodiment of the present invention.
Figure 6:
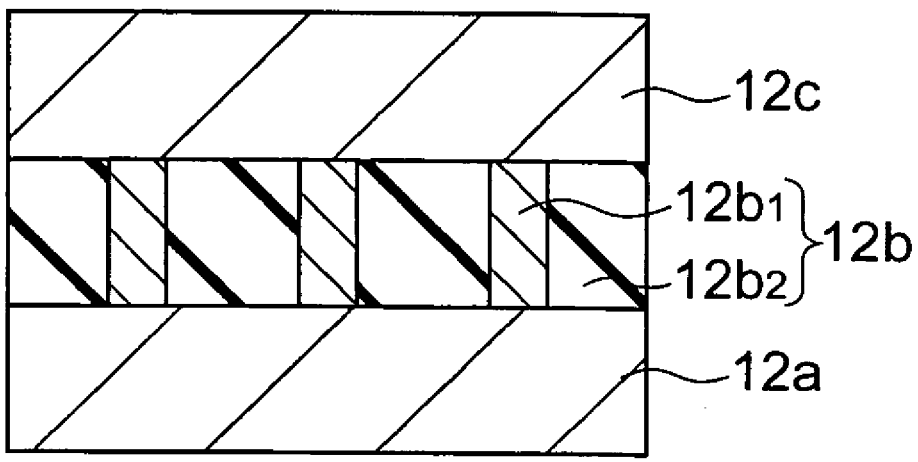
FIG. 6 is a sectional view showing a constitution of an MR film according to an embodiment of the present invention.

As shown in FIG. 3, the fine contact point $12b_1$ may have a cone-shaped section, or it may have a pillar-shaped section, as shown in FIG. 4. Further, as shown in FIGS. 5 and 6, a plurality of fine contact points $12b_1$ may be provided.

When the size of such a fine contact point is made fine in this manner, electric resistance to application of magnetic field is reduced. A size allowing development of the reduction in electric resistance depends on a sectional shape of a fine contact point, but it has been found from the result of study of the inventor that, when a maximum width of a fine contact point is set to approximately 20 nm or less, reduction in electric resistance becomes noticeable. At this time, such large magnetoresistance effect that a magnetoresistance changing rate reaches 20% or more is generated. However, in such a case that a sectional shape of a fine contact point is extremely flat, even the maximum width of the fine contact point exceeds 20 nm, reduction in electric resistance due to application of magnetic field may occur. Even a magnetic cell having such a fine contact point is included in the scope of the present invention.

When such a fine contact point is provided, material about the fine contact point in the intermediate layer 12b is formed of insulating one, and a film thickness of the intermediate layer is made thicker up to a range of about 0.2 nm to 1000 nm.

In this embodiment, the MR film 12 formed by stacking a Ta background layer with a film thickness of 5 nm, a soft magnetic layer with a film thickness of 2.5 nm made of CoFe, an intermediate layer with a film thickness of 6 nm made of Cu, a hard magnetic layer with a film thickness of 15 nm made of CoFe, an antiferromagnetic layer with a film thickness of 15 nm made of PtMn and a Ta protective layer with a film thickness of 5 nm is formed on a top portion of the electrically conductive pillar 6a and the current diffusion preventing layer 10 surrounding the pillar 6a by using an ordinary sputter process, as shown in FIG. 11. Hereinafter, a portion of the MR film formed on the electrically conductive pillar 6a is referred to as "a MR film 12" and a portion of the MR film formed on a side face of the electrically conductive pillar 6a, namely, on the current diffusion preventing layer 10 is referred to as "a support layer 12A".

Thereafter, heat treatment was performed in vacuum for about 10 hours at a temperature of 270° C. under application of magnetic field with 8×10$^5$A/m, so that an optically uniaxial magnetic anisotropy was imparted to the hard magnetic layer of the MR film 12.

Figure 12:
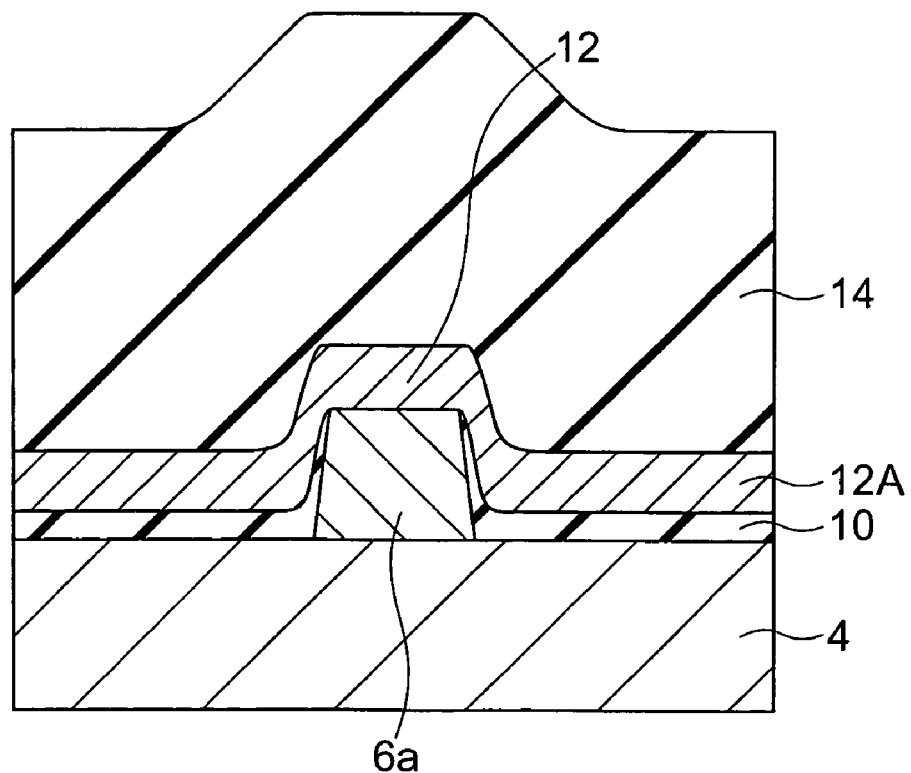
FIG. 12 is a sectional view of a step of manufacturing the magnetic cell according to the first embodiment of the present invention.

Next,.as shown in FIG. 12, an insulating material layer 14 with a thickness of 250 nm was formed on the MR film 12 and the support layer 12A. Here, material for the insulator layer 14, SiOx was used. A reactive sputter was used for the formation, and application of a high frequency bias was performed, and a taper angle near the MR film 12 was adjusted.

Figure 13:
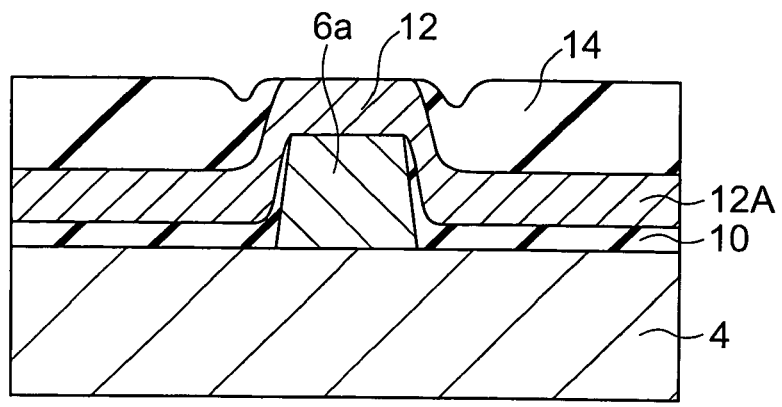
FIG. 13 is a sectional view of a step of manufacturing the magnetic cell according to the first embodiment of the present invention.

Next, after application of a planarizing resist (not shown) with a thickness of 1.2 μm was performed and baking was conducted, etch back was performed on the planarizing resist and the insulator layer 14 using carbon tetrafluoride (CF$_4$) as etching gas in an RIE (Reactive Ion Etching) of a parallel flat plate type to obtain a relatively flat surface (refer to FIG. 13). As a process for the etch back, instead of RIE, another etching process such as ion milling where such a condition that the planarizing resist and the insulator layer 14 are approximately equal to each other in etching rate, RIBE (Reactive Ion Beam Etching) or ICP (Inductively Coupled Plasma), or a process which performs direct CMP without applying planarizing resist may be used.

Figure 14:
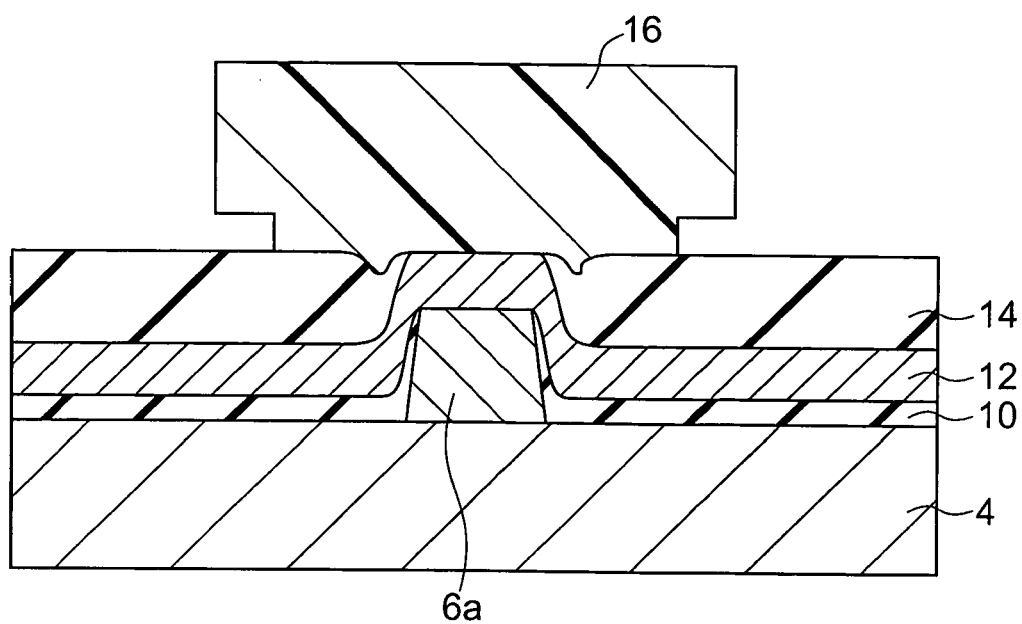
FIG. 14 is a sectional view of a step of manufacturing the magnetic cell according to the first embodiment of the present invention.
Figure 15:
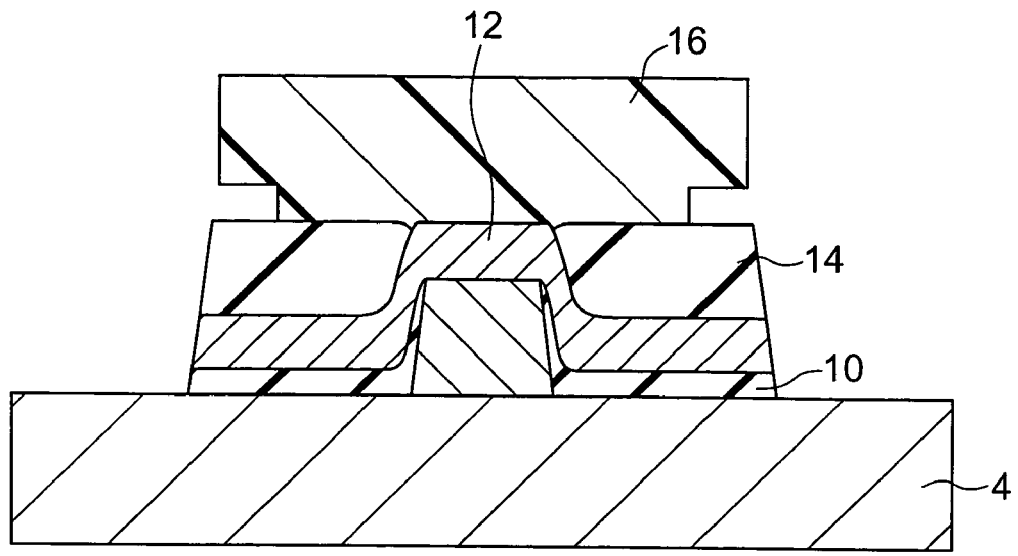
FIG. 15 is a sectional view of a step of manufacturing the magnetic cell according to the first embodiment of the present invention.
Figure 16:
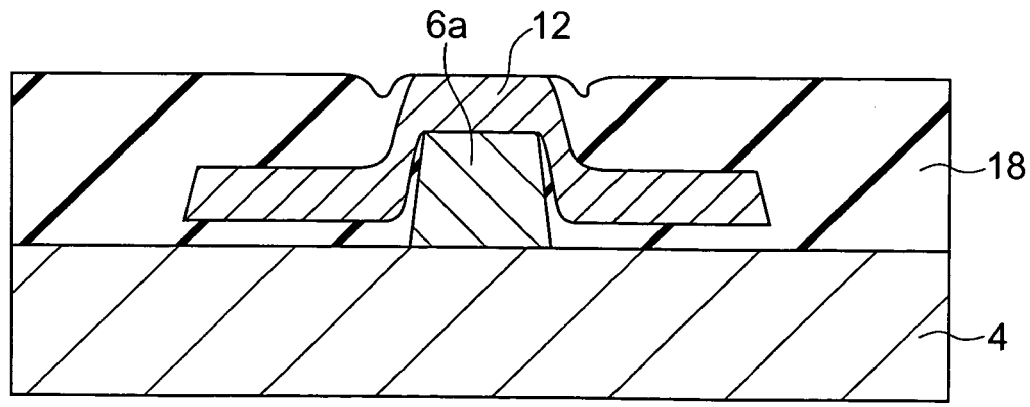
FIG. 16 is a sectional view of a step of manufacturing the magnetic cell according to the first embodiment of the present invention.

Next, a T-shaped resist pattern 16 was formed on the substantially planarized insulator layer 14 using a photo resist, as shown in FIG. 14. It is desirable that the size of the resist pattern 16 is set such that it is made larger that that of the MR film 12 and the magnetic layer on a portion of the support layer 12A can be applied with element separation. In this embodiment, a resist pattern 16 with a size of 10 μm×10 μm was used. The insulator layer 14, the support layer 12A and the current diffusion preventing layer 10 were simultaneously patterned using the resist pattern 16 as a mask by ion milling until the lower electrode layer 4 was exposed (refer to FIG. 15).

Next, while left the resist pattern 16, an insulator layer 18 was deposited and formation was made so as to generally planarize a surface of the insulator layer 18. Then, the resist pattern 16 was lifted off using organic solvent and an element separation was performed (refer to FIG. 16). The patterned insulator layer 14 and the newly deposited insulator layer 18 are hereinafter represented as an insulator layer 18.

Thereafter, a resist pattern (not shown) for contact holes with the lower electrode layer 4 was formed using a photo resist, and contact holes (not shown) were formed for an electrode portion for measuring the lower electrode layer. Then, as shown in FIG. 1, an upper electrode layer 20 was formed. A constitution of the upper electrode layer 20 included a Ta film with a film thickness of 5 nm, a Cu film with a film thickness of 400 nm, and an Au film with a film thickness of 200 nm stacked in this order from the bottom and these films were respectively formed by ordinary sputtering processes. In order to improve an embedded state during Cu film forming, a high frequency bias was applied. Thereafter, resist patterns for measuring the lower electrode layer 4 and the upper electrode layer 20 (not shown) were formed and etching of ion milling or the like was conducted thereby forming a magnetic cell.

Regarding a magnetic cell where the support layer 12A was formed from metal in this manner on the basis of the present embodiment, a comparative example 1 of a magnetic cell obtained by removing the support layer 12A on the side face of the electrically conductive pillar 6a using a resist process and formed of insulating material, where the support layer 12A was removed before magnetization fixing, a comparative example 2 of a magnetic cell obtained by removing the support layer 12A on the side face of the electrically conductive pillar 6a using a resist process and formed of insulating material, where the support layer 12A was removed after magnetization fixing, and a comparative example 3 of a magnetic cell obtained by forming an element by a milling process without using the electrically conductive pillar 6a, the results obtained by measuring a developing rate of a relationship (MR characteristic) between external magnetic field of a magnetic cell and resistance for each wafer are shown in FIG. 17.

As understood from FIG. 17, in the magnetic cell where the support layer 12A was formed from metal according to the embodiment, a high developing rate equal to 95% or more was obtained for every wafer. On the other hand, in the magnetic cell of the comparative example 1, even the developing rate of a wafer having a high developing rate was as low as about 40%, and fluctuation of the developing rate among respective wafers became much large. From the results obtained by observing the vicinity of the electrically conductive pillar of the comparative example 1 with a section TEM (Transmission Electron Microscope), it was confirmed that the electrically conductive pillar 6a fell down. It is considered that, since the support layer is formed from insulator, the falling-down is caused by strain produced during magnetization fixing due to a difference in coefficient of thermal expansion between the insulator and the metal of the pillar (portion) 6a. Further, even is in the magnetic cell of the comparative example 2 where the metal of the supporting layer portion was removed after magnetization fixing, its developing rate is about 50% at most. From the results of a section TEM observation on the comparative example 2, it was found that the pillar portion 6a fell down. It is also considered that the falling-down was caused by strain due to energy during film formation.

In the magnetic cell of the comparative example 3 formed by the milling process without using the pillar, even a developing rate of a magnetic cell having a high developing rate was about 20%, and a developing rate was about 0 in a certain wafer, which resulted in much large fluctuation, even as compared with a case where no pillar was used. It is considered that, since an element is directly etched and formed by milling, the element itself can not develop MR characteristic due to damage during the etching processing or re-adhesion of metal powder removed by etching.

In the magnetic cell of the embodiment, a high developing rate with MR characteristic was maintained and effectiveness of the electrically conductive pillar and the support layer could be confirmed.

As explained above, according to the embodiment, a magnetic cell which does not cause element falling-down and has a high developing rate of MR characteristics and reduced fluctuation can be obtained.

Next, in the MR film comprising the soft magnetic layer, the intermediate layer and the hard magnetic layer according to the present invention, control on magnetizing direction of the soft magnetic layer in current direct driving will be explained with reference to FIGS. 27 and 28.

Figure 27:
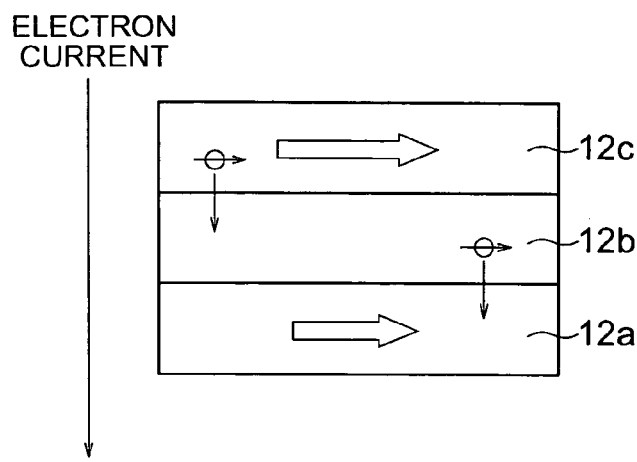
FIG. 27 is a diagram for explaining control on a magnetizing direction of a soft magnetic layer.

That is, as shown in FIG. 27, first, electron current is caused to flow from the hard magnetic layer 12c toward the soft magnetic layer 12a, which allows writing of the same direction as the magnetization of the hard magnetic layer 12c into the soft magnetic layer 12a. That is, when electron current is caused to flow in this direction, spin of electrons is polarized in the hard magnetic layer 12c according to its magnetizing direction. Electrons spin-polarized in this manner flows into the soft magnetic layer 12a so that the magnetization of the soft magnetic layer 12a is reversed in the same direction as that of the hard magnetic layer 12c.

Figure 28:
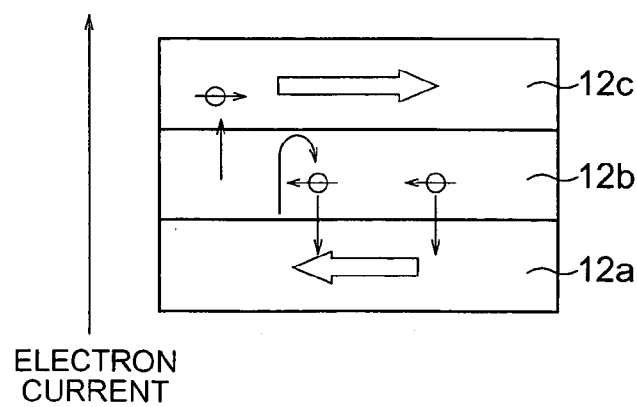
FIG. 28 is a diagram for explaining control on a magnetizing direction of a soft magnetic layer.

On the other hand, as shown in FIG. 28, electron current is caused to flow from the soft magnetic layer 12a toward the hard magnetic layer 12c, which allows writing in a reverse direction to the above-described direction. That is, spin electrons corresponding to magnetization of the hard magnetic layer 12c can easily pass through the hard magnetic layer 12c, but spin electrons in the reverse direction to the magnetization are reflected with a high probability. The spin-polarized electrons thus reflected return back to the soft magnetic layer 12a, so that the magnetization of the soft magnetic layer 12a is reversed to a direction reverse to the hard magnetic layer 12c.

In the magnetic cell manufactured in the first embodiment, it was confirmed that recording and reproducing in current effect drive type owing to magnetoresistance effect were possible by satisfying a relationship of Iw>Ir, where a value of current required for writing was represented as Iw and a value of current for conducting reading was represented as Ir. The confirmation of the recording of current direct drive type and the reproduction was obtained from almost 100% of the magnetic cells developing MR characteristic in the first embodiment.

Figure 29:
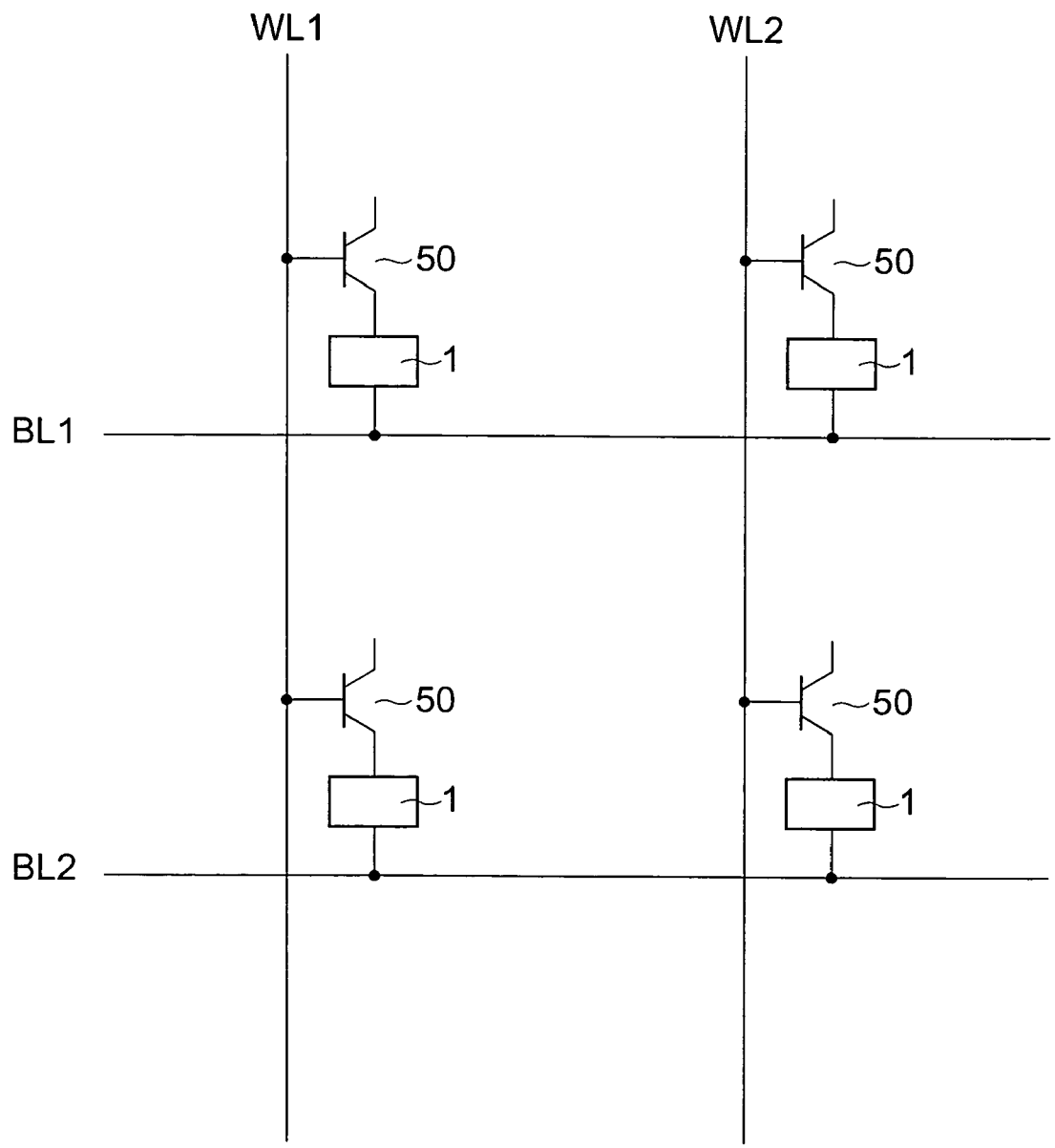
FIG. 29 is a wiring diagram of a magnetic memory where the magnetic cells according to the first embodiment are arranged in a matrix manner.

A memory cell array was formed by arranging magnetic cells 1 in a matrix of 2×2 and a magnetic memory with such connections as shown in FIG. 29 was manufactured. That is, one end (a lower electrode or au upper electrode) of the magnetic cell 1 according to the first embodiment is connected to a corresponding bit line BL1 or BL2, and the other end thereof is connected to the drain of a selecting transistor 50. The gate of the selecting transistor 50 is connected to a corresponding word line WL1 or WL2. In this array structure, writing to/reading from any cell can be performed by selecting a bit line and a word line properly.

Second Embodiment

Figure 18:
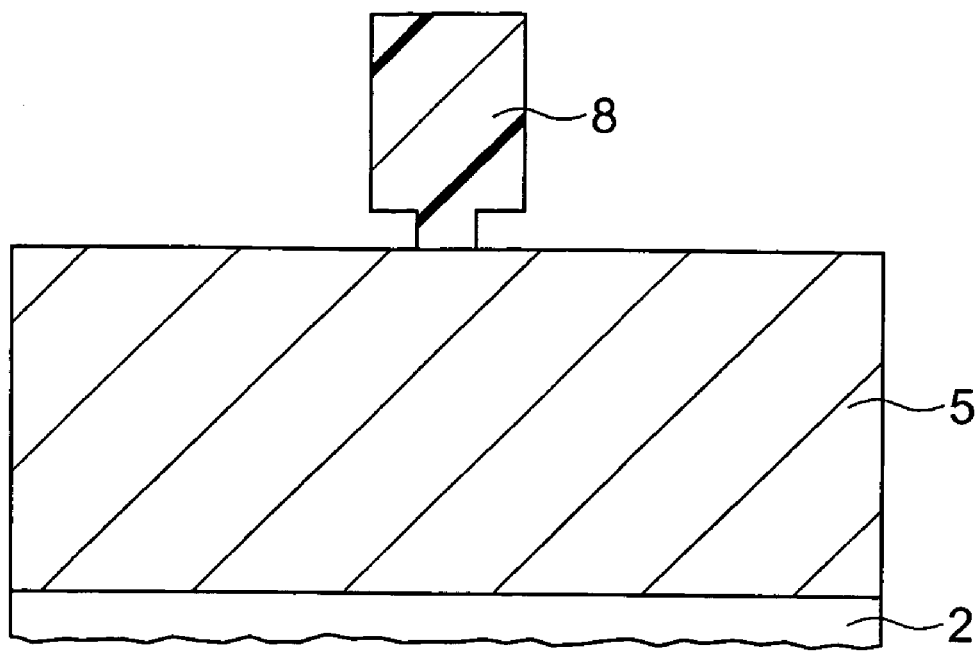
FIG. 18 is a sectional view of a step of manufacturing the magnetic cell according to a second embodiment of the present invention.
Figure 19:
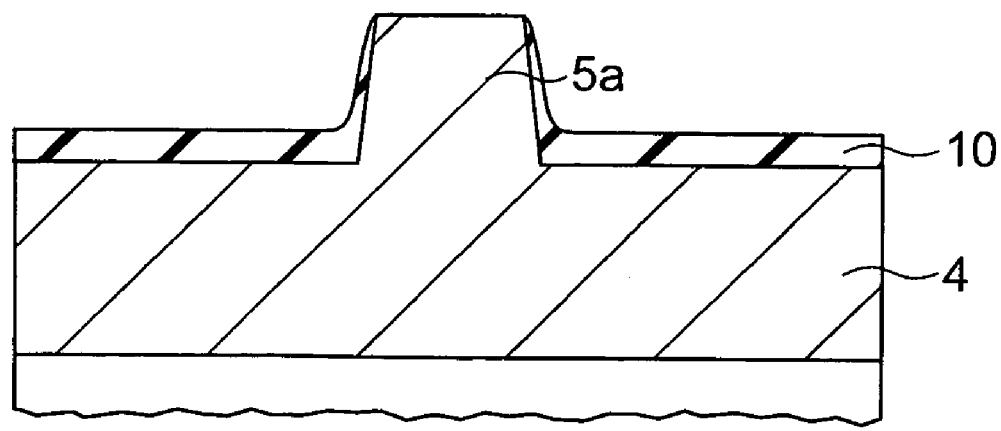
FIG. 19 is a sectional view of a step of manufacturing the magnetic cell according to the second embodiment of the present invention.
Figure 20:
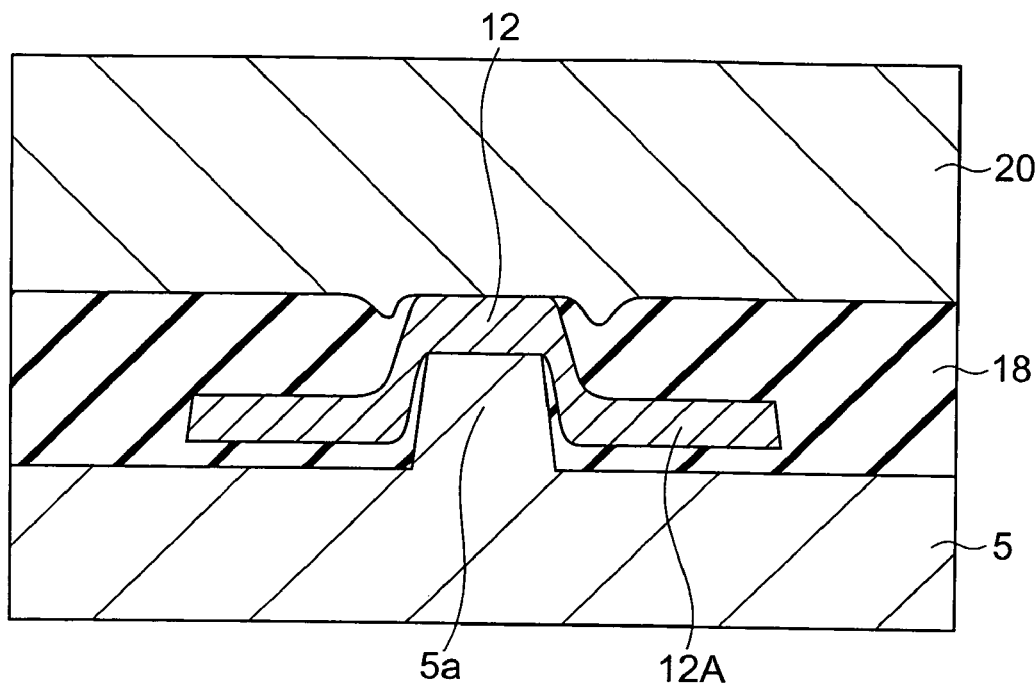
FIG. 20 is a sectional view of a step of manufacturing the magnetic cell according to the second embodiment of the present invention.
Figure 21:
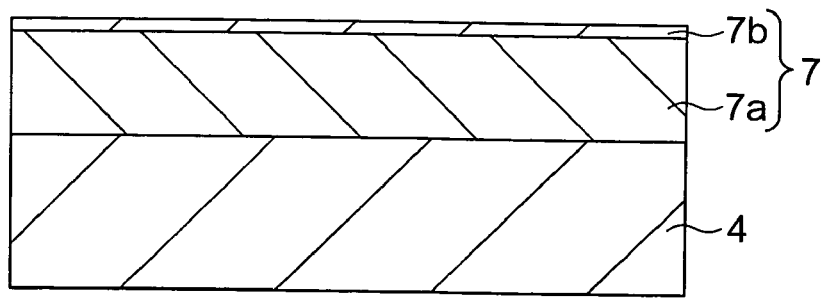
FIG. 21 is a sectional view of a step of manufacturing the magnetic cell according to a third embodiment of the present invention.
Figure 22:
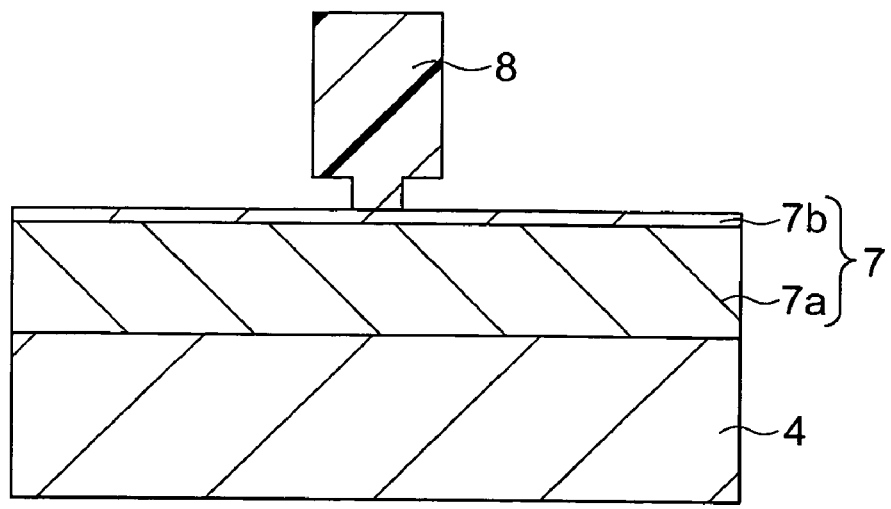
FIG. 22 is a sectional view of a step of manufacturing the magnetic cell according to the third embodiment of the present invention.

Next, a magnetic cell according to a second embodiment of the present invention will be explained with reference to FIG. 18 to FIG. 20. FIGS. 18 to 20 are sectional views showing steps of manufacturing a magnetic cell according to this embodiment. The magnetic cell according to this embodiment has a constitution that the lower electrode 4 and the electrically conductive pillar 6a are integrally formed using the same material in the magnetic cell according to the first embodiment shown in FIG. 1. A constitution of the magnetic cell according to the embodiment will be explained with reference to FIGS. 18 to 20 which are sectional views for showing manufacturing steps.

As shown in FIG. 18, first, an electrode layer 5 was formed on a substrate 2 by forming Ta (5)/Cu—Ag (400)/Ta (10) on the substrate 2 in this order from the bottom by using sputter process and it was planarized and smoothed by CMP. A blanketed numeral denotes a film thickness (nm). An electrode terminal portion (not shown) was formed on the electrode layer 5. Then, a T-shaped resist pattern 8 was formed by using a photoresist or a resist for electron beam retention (hereinafter, refer to "EB"). Here, the size of the resist pattern 8 was about 100 nm×200 nm.

Next, after a projecting portion 5a serving as an electrically conductive pillar portion with a height of 100 nm was formed by etching the electrode layer 5 using an ion milling apparatus, a current diffusion preventing layer 10 with a film thickness of 20 nm made of SiOx was deposited. Then, the resist pattern 8 was removed using organic solvent so that an electrically conductive pillar portion 5a and the current diffusion preventing layer 10 were obtained, as shown in FIG. 19.

Next, a MR film 12 was formed in the same manner as the first embodiment, an SiOx film 18 was embedded, etch back was performed, element separation of a support layer 12A was performed, a contact hole (not shown) of an electrode terminal with the lower electrode layer 5 was formed, an upper electrode 20 was formed so that a magnetic cell was formed (refer to FIG. 20).

In the magnetic cell with the support layer 12A made of metal on the basis of the embodiment, effectiveness of the support layer 12A made of metal and the electrically conductive pillar 5a was confirmed like the first embodiment.

As explained above, according to the embodiment, a magnetic cell which does not cause element falling-down and has a high developing rate of MR characteristics and reduced fluctuation can be obtained.

When recording and reproducing of current direct drive type was confirmed, they were realized in almost 100% of the cells developing MR characteristics in the second embodiment. Writing and reading could be performed to a magnetic memory having a memory cell array where the magnetic cells according to the second embodiment were arranged in a matrix of 2×2.

Third Embodiment

Next, a magnetic cell according to a third embodiment of the present invention will be explained with reference to FIG. 21 to FIG. 26. FIGS. 21 to 26 are sectional views showing steps of manufacturing a magnetic cell according to the embodiment.

First, a lower electrode layer 4 was formed on a substrate (not shown) by stacking Ta (5)/Cu—Ag (400)/Ta (40) on the substrate in this order by sputter process, and it was planarized by CMP. A Blanketed number denotes a film thickness (nm). An electrically conductive film 7 comprising a Cu layer 7a with a film thickness of 90 nm and a Ta layer 7b with a film thickness of 10 nm was formed on the planarized lower electrode layer 4 (refer to FIG. 21).

Next, a T-shaped resist pattern 8 was formed on the electrically conductive film 7 by using a photoresist or a resist for electron beam retention. Here, the size of the resist pattern 8 was about 100 nm×200 nm.

Figure 23:
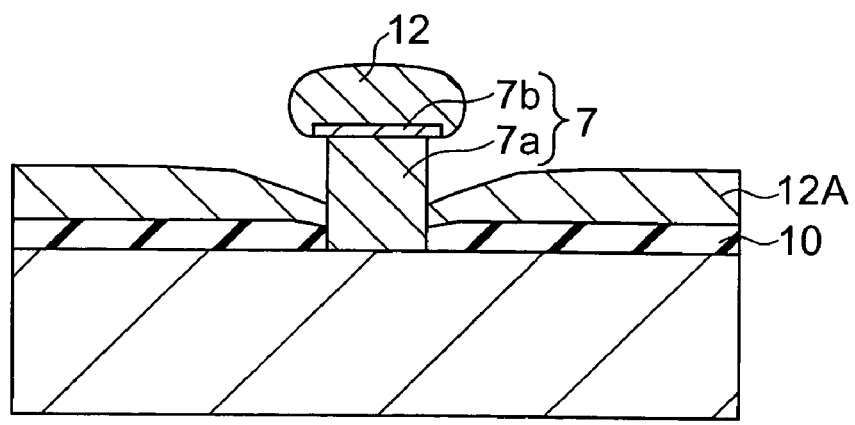
FIG. 23 is a sectional view of a step of manufacturing the magnetic cell according to the third embodiment of the present invention.

Next, the electrically conductive film 7 was patterned utilizing the resist pattern 8 as a mask by using a reactive ion etching (RIE), and the electrically conductive film 7 was formed in a T shape, as shown in FIG. 23. The electrically conductive film 7 serves as a T-shaped electrically conductive pillar. Then, while left the resist pattern 8, an $SiO_2$ film 10 functioning as a current diffusion preventing layer was stacked up to a thickness of 20 nm. Further, the mask was lifted off using organic solvent, and the T-shaped electrically conductive pillar 7 and the current diffusion preventing layer 10 were formed (refer to FIG. 23). Subsequently, an MR film 12, namely, a stacked film 12 comprising a Ta layer with a film thickness of 5 nm, a soft magnetic layer with a film thickness of 2.5 nm made of CoFe, an intermedieate layer with a film thickness of 6 nm made of Cu, a hard magnetic layer with a film thickness of 15 nm made of CoFe, an antiferromagnetic layer with a film thickness of 15 nm made of PtMn, and a Ta layer with a film thickness of 5 nm formed in this order from the bottom was formed and it was annealed in magnetic filed in vacuum, so that optically uniaxial anisotropy was pinned in the hard magnetic layer. A portion of the stacked layer formed on the electrically conductive film 7 serves as an MR film 12 and another portion of the stacked film formed on the current diffusion preventing layer 10 serves as a support layer 12A (refer to FIG. 23). The T-shaped electrically conductive pillar has a first part 7a and a second part 7b. The second part 7b closer to the MR film 12 has a wider width than that of the first part 7a remoter from the MR film.

Figure 24:
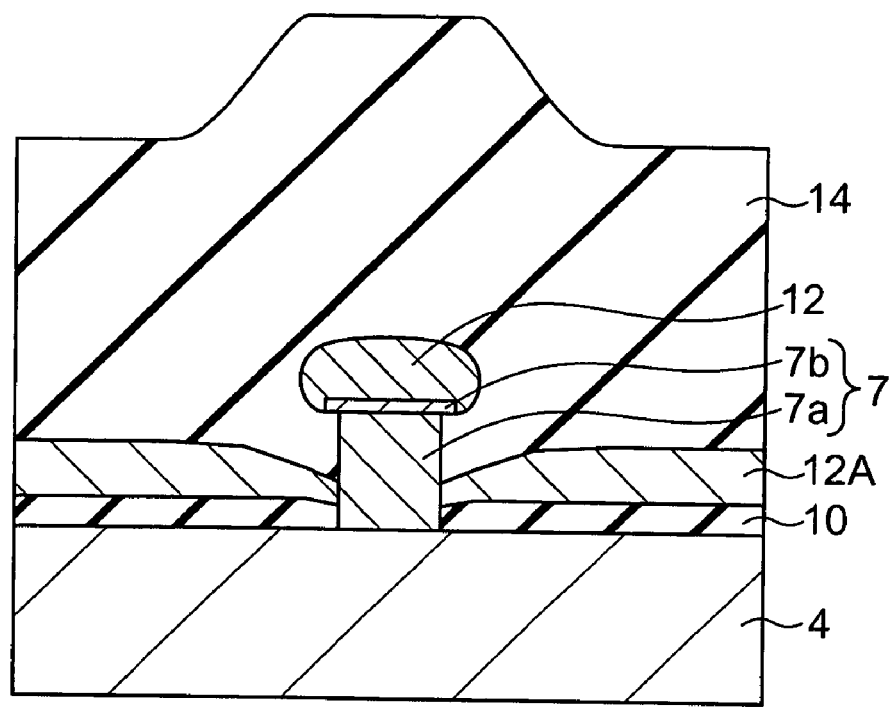
FIG. 24 is a sectional view of a step of manufacturing the magnetic cell according to the third embodiment of the present invention.
Figure 25:
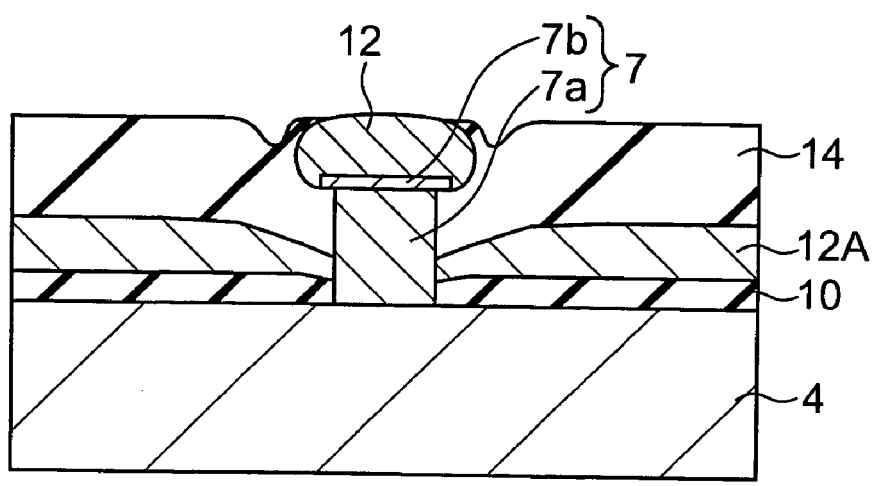
FIG. 25 is a sectional view of a step of manufacturing the magnetic cell according to the third embodiment of the present invention.

Next, a $SiO_2$ film 14 with a film thickness of 250 nm was formed so as to cover the MR film 12 and the support layer 12A (refer to FIG. 24). Then, planarizing resist (not shown) was applied on the $SiO_2$ film 14, and etch back was performed, so that the $SiO_2$ film 14 was planarized (refer to FIG. 25). Thereafter, a resist pattern (not shown) for contact holes with the lower electrode layer 4 was formed on the photoresist, and contact holes (not shown) for an electrode portion for measuring the lower electrode layer 4 were formed.

Figure 26:
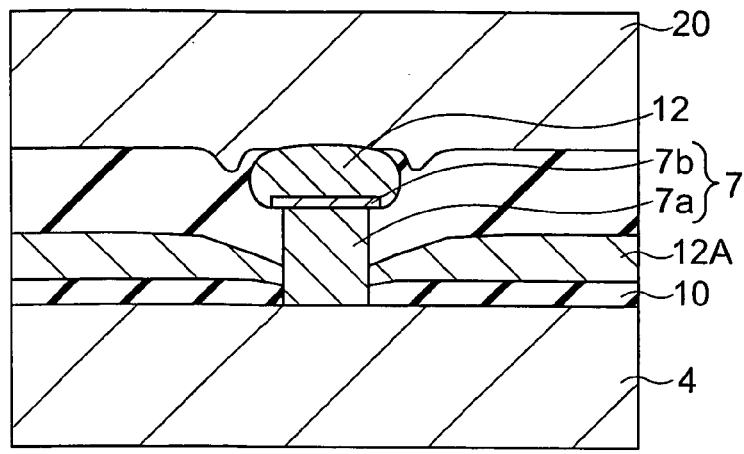
FIG. 26 is a sectional view of a step of manufacturing the magnetic cell according to the third embodiment of the present invention.

Next, as shown in FIG. 26, an upper electrode layer 20 was formed. The layer 20 had a constitution where a Ta film with a film thickness of 5 nm, a Cu film with a film thickness of 400 nm and an Au film with a film thickness of 200 nm was formed in this order from the bottom using an ordinary sputter process. Incidentally, in order to improve an embedded state during Cu film forming, a high frequency bias was applied. Then, resist patterns (not shown) for measuring the lower electrode layer 4 and the upper electrode layer 20 were formed, and etching conducted by ion milling or the like was applied to the resist patterns so that a magnetic cell was formed.

In the magnetic cell with the support layer made of metal on the basis of the embodiment in this manner, effectiveness of the support layer made of metal and the electrically conductive pillar was confirmed like the first embodiment.

As explained above, according to the embodiment, a magnetic cell which does not cause element falling-down and has a high developing rate of MR characteristics and reduced fluctuation can be obtained.

When recording and reproducing of current direct drive type was confirmed, they were realized in almost 100% of the cells developing MR characteristics in the third embodiment. Writing and reading could be performed to a magnetic memory having a memory cell array where the magnetic cells according to the third embodiment were arranged in a matrix of 2×2.

Fourth Embodiment

Next, a magnetic cell according to a fourth embodiment of the present invention will be explained with reference to FIG. 30 to FIG. 35. FIGS. 30 to 35 are sectional views showing steps of manufacturing a magnetic cell according to the embodiment.

Figure 30:
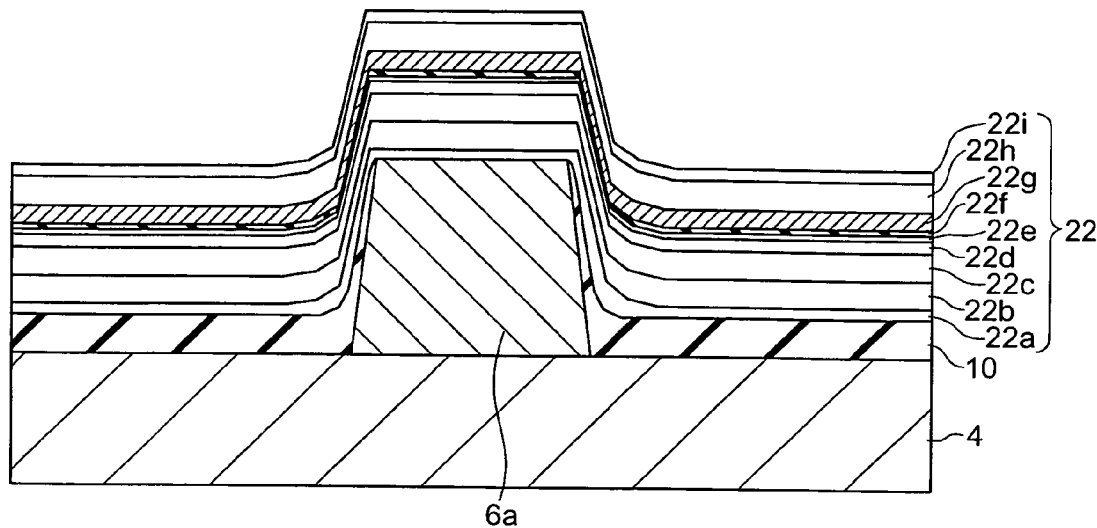
FIG. 30 is a sectional view of a step of manufacturing the magnetic cell according to a fourth embodiment of the present invention.

As shown in FIG. 30, first, an electrically conductive pillar portion 6a and a current diffusion preventing layer 10 were formed on a lower electrode layer 4 like the first embodiment.

Next, a magnetic cell having a five-layered structure comprising a first hard magnetic film/an intermediate layer/a soft magnetic film/a non-magnetic layer 22d/a second hard magnetic layer as an MR film 22 was manufactured. Here, it is desirable that the materials described above are used as materials for the first and second hard magnetic layers, the intermediate layer, and the soft magnetic layer. It is desirable that, as material for the non-magnetic layer, insulator including oxide, nitride or fluoride containing at least one element selected from a group consisting of aluminum (Al), titanium (Ti), tantalum (Ta), cobalt (Co), nickel (Ni), silicon (Si) and iron (Fe) is used. It is desirable that a thickness of the non-magnetic layer is in a range of 0.2 nm to 10 nm. As shown in FIG. 3 to FIG. 6, respectively, the "point contact", or the fine contact with one of various shapes point may be provided in the non-magnetic layer.

In this embodiment, the MR film 22 with such a constitution was a stacked film comprising a Ta layer 22a with a film thickness of 5 nm, an antiferromagnetic layer 22b with a film thickness of 15 nm made of PtMn, a first hard magnetic layer 22c with a film thickness of 15 nm made of CoFe, an intermediate layer 22d with a film thickness of 6 nm made of Cu, a soft magnetic layer 22e with a film thickness of 2.5 nm made of CoFe, a non-magnetic layer 22f with a film thickness of 3 nm made of $Al_2O_3$, a second hard magnetic layer 22g with a film thickness of 10 nm made of CoFe, an antiferromagnetic layer 22h with a film thickness of 15 nm made of PtMn, and a Ta layer 22i with a film thickness of 5 nm stacked in this order from the bottom. After formation of the MR film 22, heat treatment was performed in order to apply an optical uniaxial anisotropy to the first and second hard magnetic layers 22c and 22g.

Figure 31:
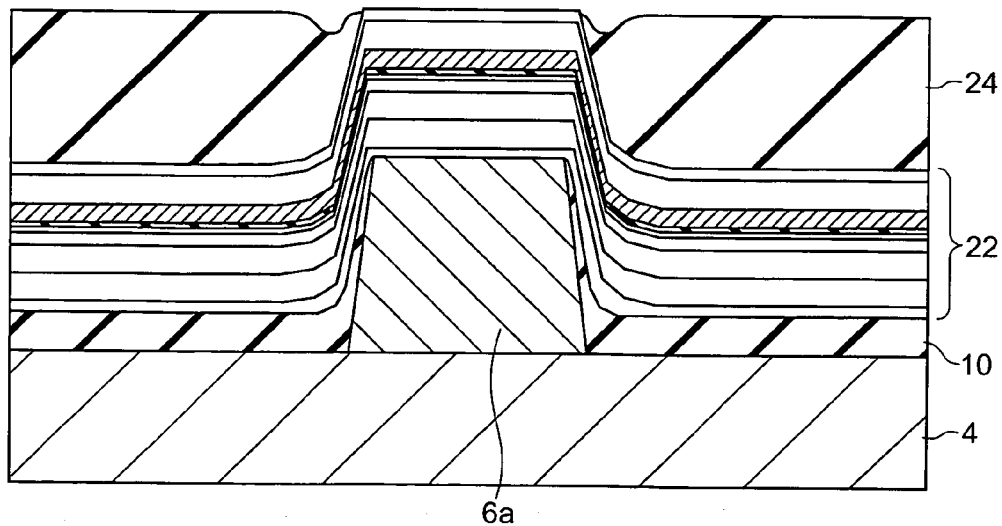
FIG. 31 is a sectional view of a step of manufacturing the magnetic cell according to the fourth embodiment of the present invention.
Figure 32:
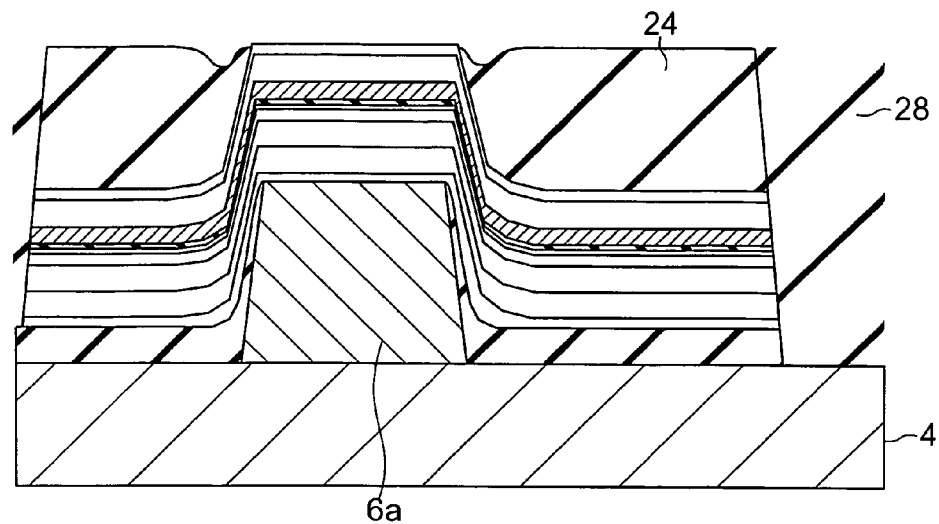
FIG. 32 is a sectional view of a step of manufacturing the magnetic cell according to the fourth embodiment of the present invention.

Next, as shown in FIG. 31, an insulator layer 24 was formed and a substantial planarization on the insulator layer 24 was performed using planarizing resist. Then, a photoresist pattern (not shown) was formed so as to have a size of 10 μm×20 μm and have a T shape in a vertical section, milling was performed down to the lower electrode layer 4 using the resist pattern as a mask, an SiOx film 28 was embedded and formed as it was until a surface thereof was substantially planarized, an element isolation was performed, and the resist pattern was removed using organic solvent (refer to FIG. 32).

Figure 33:
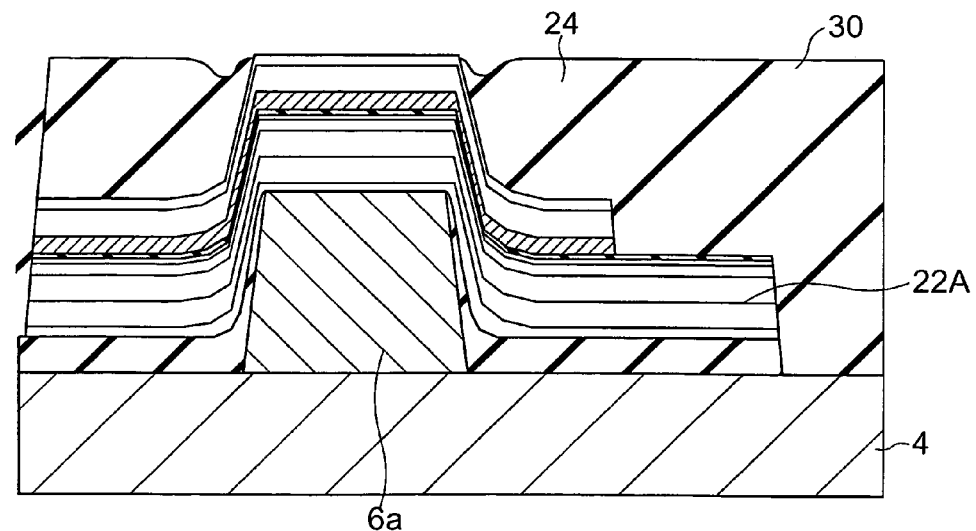
FIG. 33 is a sectional view of a step of manufacturing the magnetic cell according to the fourth embodiment of the present invention.
Figure 34:
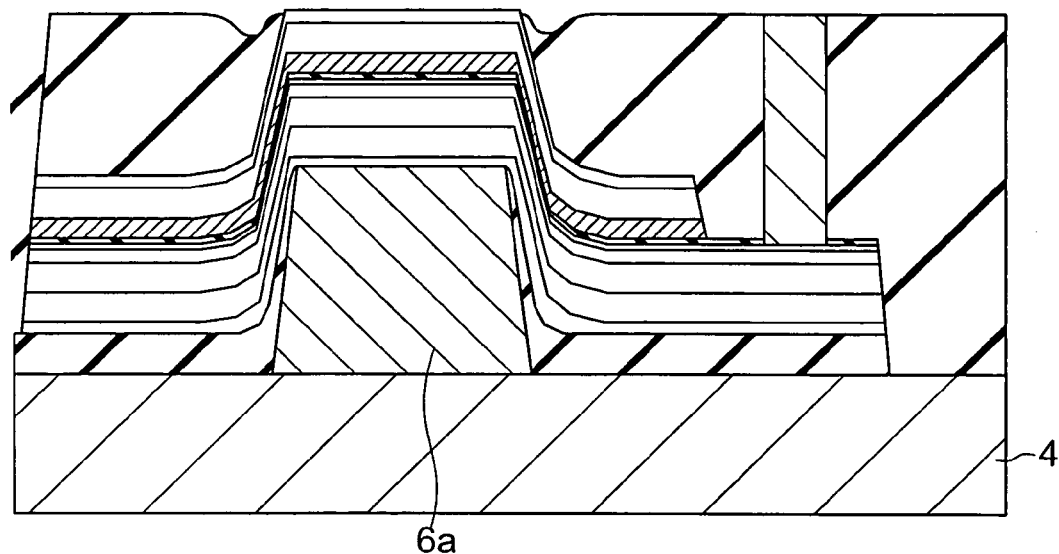
FIG. 34 is a sectional view of a step of manufacturing the magnetic cell according to the fourth embodiment of the present invention.
Figure 35:
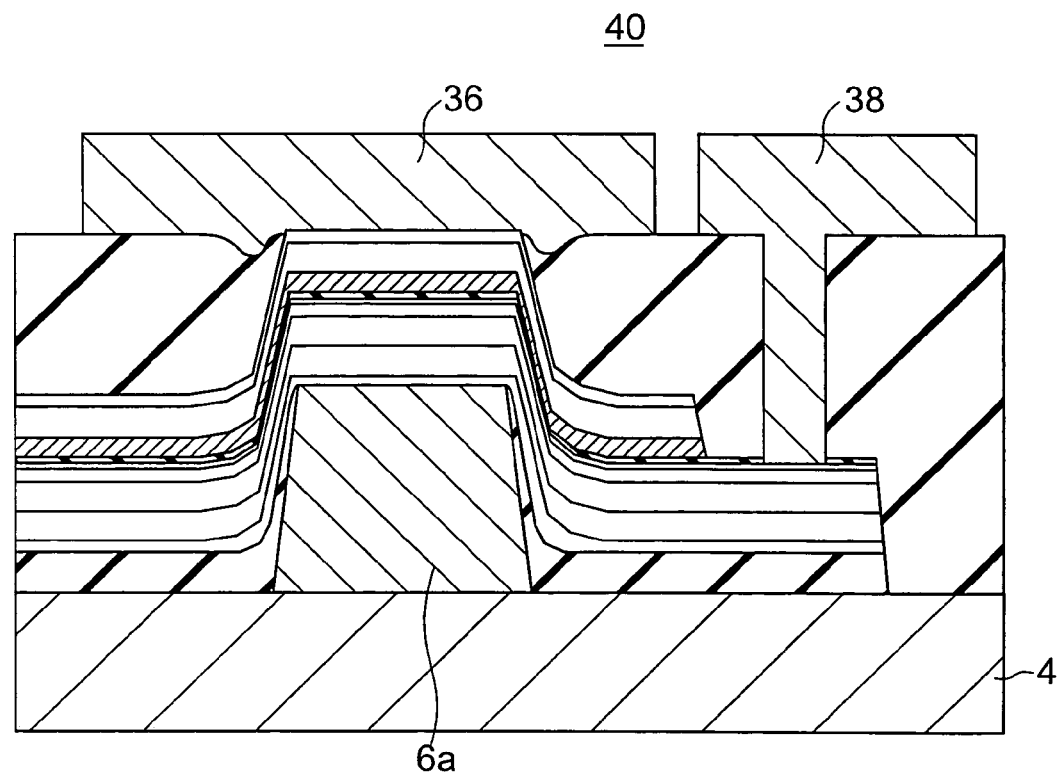
FIG. 35 is a sectional view of a step of manufacturing the magnetic cell according to the fourth embodiment of the present invention.

Subsequently, a T-shaped resist pattern (not shown) with a size of 10 μm×10 μm was formed, milling was performed using the resist pattern as a mask until an $Al_2O_3$ layer 22f of a support layer 22A was exposed, embedding and film forming was performed until an SiOx film 30 were generally planarized, and the resist pattern was removed using organic solvent (refer to FIG. 33).

Next, a resist pattern (not shown) having an opening with a diameter of 5 μm was formed, milling was performed using the resist pattern as a mask until the soft magnetic layer 22e of the support layer 22 was exposed, an electrode film functioning as an electrode 34 for measuring an intermediate layer was formed by IBD (Ion Beam Deposition) using sputter particles with high directivity, and the resist was removed by using organic solvent. In this embodiment, an electrode 34 with a film thickness of 70 nm made of Cu was formed (refer to FIG. 34).

Then, a resist pattern (not shown) for contact hole for the lower electrode layer 4 was formed using photoresist, and contact holes (not shown) for a measuring electrode portion of a lower electrode layer were formed.

Next, an electrode film was formed. A constitution of this film includes a Ta layer with a film thickness of 5 nm, a Cu layer with a film thickness of 400 nm and an Au layer with a film thickness of 200 nm, and these layers were formed using an ordinary sputter process. In order to improve an embedded state during Cu film forming, a high frequency bias was applied. Thereafter, a resist pattern (not shown) for forming the lower electrode 4, the upper electrode 36 and a measuring electrode of the soft magnetic layer 22e was formed, etching of ion milling or the like was performed on the electrode film and the lower electrode layer using the resist pattern as a mask to form the lower electrode 4, the upper electrode 36 and the measuring electrode 38, so that a magnetic cell 40 was completed.

In the magnetic cell 40 according to the embodiment thus manufactured, it was confirmed that, by providing differences in potential among the lower electrode, the intermediate measuring electrode and the upper electrode, recording of a current direct drive type could be performed on the soft magnetic layer and reproduction of record contents owing to magnetoresistance effect could be made possible.

Figure 36:
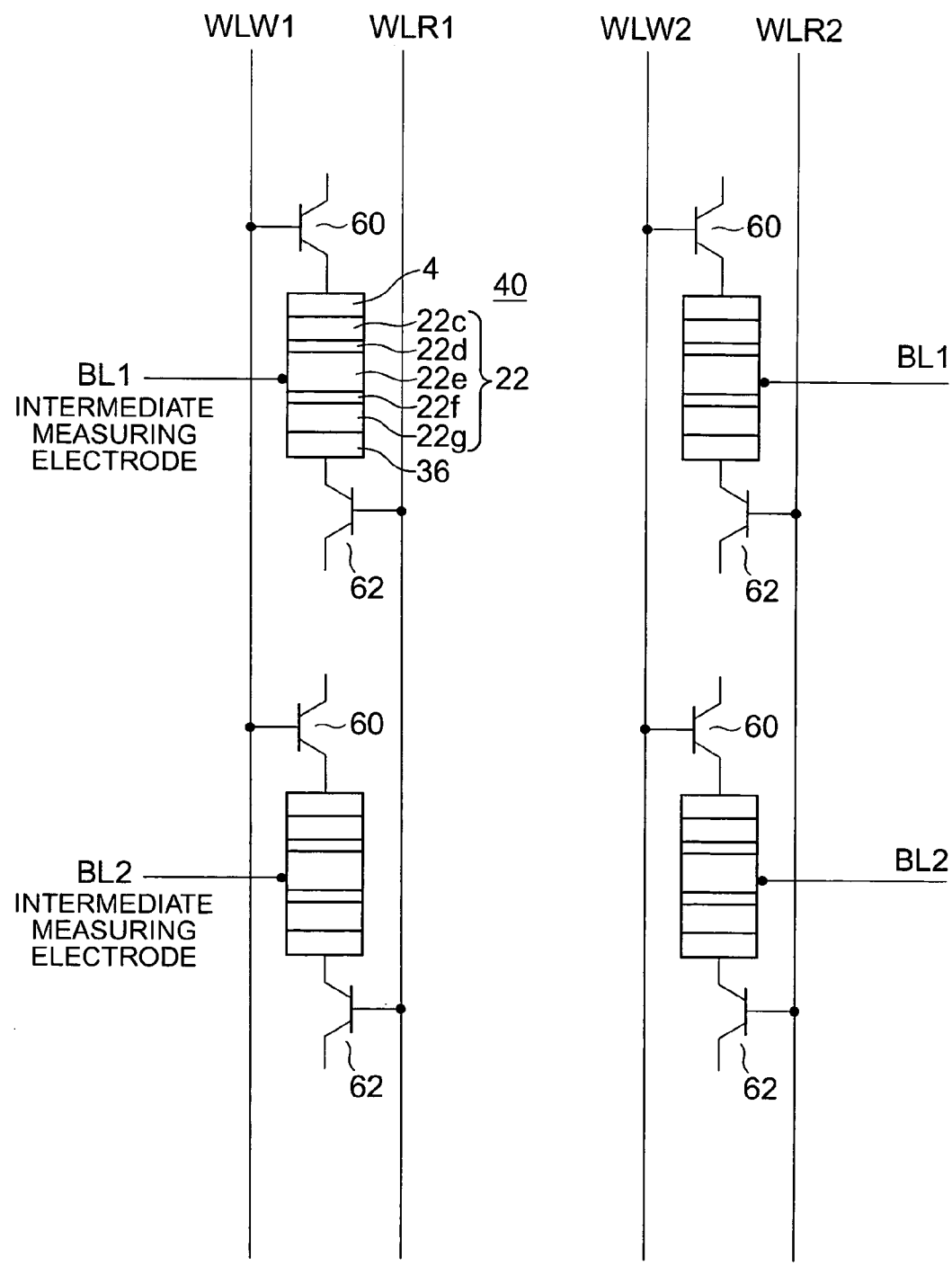
FIG. 36 is a wiring diagram of a magnetic memory where is the magnetic cells according to the fourth embodiment are arranged in a matrix manner.

A memory cell array was formed by arranging magnetic cells 40 in a matrix shape of 2×2 and a magnetic memory with such connections as shown in FIG. 36 was manufactured. In FIG. 36, the MR film 22 constituting the magnetic cell 40 is shown to have only the first hard magnetic layer 22c, the intermediate layer 22d, the soft magnetic layer 22e, the non-magnetic layer 22f, and the second magnetic layer 22g, where the antiferromagnetic layer is omitted. The electrically conductive layer 6a is also omitted in FIG. 36. The lower electrode 4 is connected to the drain of a selecting transistor 60, and the gate of the selecting transistor 60 is connected to a corresponding writing word line WLWi (i=1, 2). Such a constitution is employed that the upper electrode 36 is connected to the drain of a selecting transistor 62 and the gate of the selecting transistor 62 is connected to a corresponding reading word line WLRi (i=1, 2). The selecting transistors 60 and 62 are provided for each of the magnetic cells 40. The measuring electrode connected to the soft magnetic layer 22e is connected to a corresponding bit line BL1 or BL2. In the array structure, when writing is performed, the writing can be performed on a selected magnetic cell by properly selecting a writing word line WLWi (i=1, 2) and a bit line BLj (j=1, 2), and when reading is performed, reading from a selected magnetic cell can be performed by properly selecting a reading word line WLRi (i=1, 2,) and a bit line BLj (j=1, 2).

Fifth Embodiment

Next, a magnetic cell according to a fifth embodiment of the present invention will be explained. A magnetic cell according to this embodiment had a constitution that a Ta layer with a film thickness of 5 nm, an antiferromagnetic layer with a film thickness of 15 nm made of PtMn, a first hard magnetic layer with a film thickness of 15 nm made of CoFe, an intermediate layer with a film thickness of 6 nm made of Cu, a soft magnetic layer with a film thickness of 2.5 nm made of CoFe, a non-magnetic layer with a film thickness of 3 nm made of $Al_2O_3$, a second hard magnetic layer with a film thickness of 10 nm made of CoFe, an antiferromagnetic layer with a film thickness of 15 nm made of PtMn and a Ta layer with a film thickness of 5 nm were formed on an electrically conductive pillar and a current diffusion preventing layer formed in the same manner as the second embodiment from the bottom like the fourth embodiment, and formation up to an electrode layer including an intermediate measuring electrode was performed.

It could be confirmed that the magnetic cell thus formed allowed recording and reproducing of a current direct drive type like the fourth embodiment.

A memory cell array was formed by arranging magnetic cells in a matrix of 2×2 and a magnetic memory with such connections as shown in FIG. 36 was manufactured. In the array structure, when writing is performed, the writing can be performed on a selected magnetic cell by properly selecting a writing word line WLWi (i=1, 2) and a bit line BLj (j=1, 2), and when reading is performed, reading from a selected magnetic cell can be performed by properly selecting a reading word line WLRi (i=1, 2,) and a bit line BLj (j=1, 2).

As described above, according to each of the embodiments of the present invention, a magnetic cell having a high developing rate of MR characteristics and a reduced fluctuation without causing element falling-down and a magnetic memory having the same can be obtained.

In the above, the embodiments of the present invention has been explained with reference to specific embodiments or is examples. However, the present invention is not limited to these specific examples. For example, regarding specific dimensional relationship or material for each element constituting a magnetic cell, and other shapes or materials for electrode, passivation, insulation structures, they will be included in the scope of the invention as far as those skilled in the art properly select them in known ranges so that the present invention can be similarly implemented and similar advantage or merits can be obtained.

Constituent elements such as an antiferromagnetic layer, a hard magnetic layer, an intermediate layer, a soft magnetic layer, a non-magnetic layer and the like may be formed as single layers, respectively, or at least two thereof may have a stacked structure.

Besides, all magnetic cells and magnetic memory which can be implemented according to design modifications made by those skilled in the art on the basis of the magnetic cell or the magnetic memory described above as the embodiments of the present invention belong to the scope of the present invention, as far as they include the spirit of the present invention.

As explained above, since a support layer mainly formed of metal is present in the invention, an electrically conductive pillar and a multi-layer function layer portion can be prevented falling down due to a difference in coefficient of thermal expansion during annealing or depositing process. Further, since a millingless process is applied to an MR film, an element with a high reproducibility which is not damaged without re-deposition and does not depend on directivity characteristics of a film forming apparatus or an MR film, and can accommodate a multi-terminal structure can be provided. Furthermore, since these magnetic cells are very fine, they are much useful for a high density and a multi-functioning of a magnetic element, and a reduction in total size of an element including a magnetic cell and a vast industrial merit can be obtained.

What is claimed is:

1. A magnetic cell comprising:
   a lower electrode;
   an electrically conductive pillar formed on the lower electrode;
   a magnetoresistance effect film having at least two ferromagnetic layers formed on the electrically conductive pillar and an intermediate layer provided between the ferromagnetic layers;
   an upper electrode formed on the magnetoresistance effect film;
   a support layer formed from at least one metal directly on a side face of the electrically conductive pillar or via an insulating layer; and
   a current diffusion preventing layer provided between the support layer and the lower electrode, a height of the electrically conductive pillar, a thickness of the current diffusion preventing layer, and a thickness of the support layer satisfying relationships of $$h > t1 + t2 > \frac{30}{30+L} \times h$$

where h represents the height of the electrically conductive pillar, t1 represents the thickness of the current diffusion preventing layer, t2 represents the thickness of the support layer, and L (nm) represents a length of a short side of the electrically conductive pillar.

2. A magnetic cell according to claim 1, wherein the magnetoresistance effect film is provided with a reference magnetic layer including a ferromagnetic layer whose magnetizing direction has been pinned, a recording magnetic layer including a ferromagnetic layer, and an intermediate layer provided between the reference magnetic layer and the recording magnetic layer, and spin-polarized electron current flows in the magnetic recording layer due to causing writing current to flow from the reference magnetic layer to the recording magnetic layer and magnetization of the ferromagnetic layer in the magnetic recording layer is changed to an approximately parallel direction to the pinned magnetization of the ferromagnetic layer of the reference magnetic layer or an approximately anti-parallel direction by the spin-polarized electron current.

3. A magnetic cell according to claim 1, wherein the magnetoresistance effect film comprises:
 a first reference magnetic layer including a first ferromagnetic layer whose magnetization has been pinned in a first direction,
 a second reference magnetic layer including a second ferromagnetic layer whose magnetization has been pinned in a second direction,
 a recording magnetic layer provided between the first and second reference magnetic layers and including a third ferromagnetic layer;
 an intermediate layer provided between the first reference magnetic layer and the recording magnetic layer; and
 a non-magnetic layer provided between the second reference magnetic layer and the recording magnetic layer.

4. A magnetic cell according to claim 3, wherein spin-polarized electron current flows in the magnetic recording layer due to causing writing current to flow from the first reference magnetic layer to the recording magnetic layer, and magnetization of the ferromagnetic layer in the magnetic recording layer is changed to an approximately parallel direction to the pinned magnetization of the ferromagnetic layer of the reference magnetic layer or an approximately anti-parallel direction by the spin-polarized electron current.

5. A magnetic cell according to claim 1, wherein the intermediate layer is formed of an insulator with pin holes, and the pin holes are filled with material including at least one of noble metals such as copper (Cu), silver (Ag), gold (Au).

6. A magnetic cell according to claim 1, wherein the intermediate layer is formed of an insulator with pin holes, and the pin holes are filled with material for the ferromagnetic layer adjacent to both sides of the intermediate layer.

7. A magnetic cell according to claim 1, wherein the ferromagnetic layer of the recording magnetic layer is made from magnetic material having a softer magnetism than material from the ferromagnetic layer of the reference magnetic layer.

8. A magnetic cell according to claim 1, further comprising an antiferromagnetic layer which applies exchanging bias magnetic field to the reference magnetic layer.

9. A magnetic cell according to claim 1, wherein the electrically conductive pillar is formed in a T shape.

10. A magnetic memory comprising:
 a memory cell array comprising a plurality of magnetic cells arranged in array manner; and a selecting unit which selects a magnetic cell in the memory cell array to cause writing current or sense current to flow in the selected magnetic cell,
 each of the magnetic cell comprising:
  a lower electrode;
  an electrically conductive pillar formed on the lower electrode;
  a magnetoresistance effect film having at least two ferromagnetic layers formed on the electrically conductive pillar and an intermediate layer provided between the ferromagnetic layers;
  an upper electrode formed on the magnetoresistance effect film;
  a support layer formed from at least one metal directly on a side face of the electrically conductive pillar or via an insulating layer;
  and a current diffusion preventing layer provided between the support layer and the lower electrode,
  a height of the electrically conductive pillar, a thickness of the current diffusion preventing layer, and a thickness of the support layer satisfying relationships of $$h > t1 + t2 > \frac{30}{30+L} \times h$$

where h represents the height of the electrically conductive pillar, t1 represents the thickness of the current diffusion preventing layer, t2 represents the thickness of the support layer, and L (nm) represents a length of a short side of the electrically conductive pillar.

11. A magnetic memory according to claim 10, wherein the selecting unit has selecting transistors which are provided so as to correspond to respective magnetic cells and whose drains are connected to ones of the lower electrodes and the upper electrodes of corresponding magnetic cells, a word line connected to gates of the selecting transistors corresponding to magnetic cells disposed in the same row, and a bit line connected to the others of the lower electrodes and the upper electrodes of magnetic cells disposed in the same column.

12. A magnetic cell according to claim 10, wherein the magnetoresistance effect film is provided with a reference magnetic layer including a ferromagnetic layer whose magnetizing direction has been pinned, a recording magnetic layer including a ferromagnetic layer, and an intermediate layer provided between the reference magnetic layer and the recording magnetic layer, and spin-polarized electron current flows in the magnetic recording layer due to causing writing current to flow from the reference magnetic layer to the recording magnetic layer and magnetization of the ferromagnetic layer in the magnetic recording layer is changed to an approximately parallel direction to the pinned magnetization of the ferromagnetic layer of the reference magnetic layer or an approximately anti-parallel direction by the spin-polarized electron current.

13. A magnetic memory according to claim 10, wherein the magnetoresistance effect film comprises:
- a first reference magnetic layer including a first ferromagnetic layer whose magnetization has been pinned in a first direction,
- a second reference magnetic layer including a second ferromagnetic layer whose magnetization has been pinned in a second direction,
- a recording magnetic layer provided between the first and second reference magnetic layers and including a third ferromagnetic layer;
- an intermediate layer provided between the first reference magnetic layer and the recording magnetic layer; and
- a non-magnetic layer provided between the second reference magnetic layer and the recording magnetic layer.

14. A magnetic cell according to claim 13, wherein spin-polarized electron current flows in the magnetic recording layer due to causing writing current to flow from the first reference magnetic layer to the recording magnetic layer, and magnetization of the ferromagnetic layer in the magnetic recording layer is changed to an approximately parallel direction to the pinned magnetization of the ferromagnetic layer of the reference magnetic layer or an approximately anti-parallel direction by the spin-polarized electron current.

15. A magnetic memory according to claim 13, wherein the selecting unit has first selecting transistors which are provided so as to correspond to respective magnetic cells and whose drains are connected to the lower electrodes of corresponding magnetic cells, second selecting transistors which are provided so as to correspond to respective magnetic cells and whose drains are connected to the upper electrodes of corresponding magnetic cells, a first word line connected to gates of the first selecting transistors corresponding to magnetic cells disposed in the same row, a second word line connected to gates of second selecting transistors corresponding to magnetic cells disposed in the same row, and a bit line connected to the other of the lower electrodes and the upper electrodes of magnetic cells disposed in the same column.

16. A magnetic cell according to claim 10, wherein the intermediate layer is formed of an insulator with pin holes, and the pin holes are filled with material including at least one of noble metals such as copper (Cu), silver (Ag), gold (Au).

17. A magnetic cell according to claim 10, wherein the intermediate layer is formed of an insulator with pin holes, and the pin holes are filled with material for the ferromagnetic layer adjacent to both sides of the intermediate layer.

18. A magnetic cell according to claim 10, wherein the ferromagnetic layer of the recording magnetic layer is made from magnetic material having a softer magnetism than material from the ferromagnetic layer of the reference magnetic layer.

19. A magnetic cell according to claim 10, further comprising an antiferromagnetic layer which applies exchanging bias magnetic field to the reference magnetic layer.

20. A magnetic cell according to claim 10, wherein the electrically conductive pillar is formed in a T shape.

* * * * *